(12) United States Patent
Zewail et al.

(10) Patent No.: US 12,562,943 B2
(45) Date of Patent: Feb. 24, 2026

(54) PREAMBLE DESIGN FOR AMBIENT-INTERNET OF THINGS

(71) Applicant: QUALCOMM Incorporated, San Diego, CA (US)

(72) Inventors: Ahmed Abdelaziz Ibrahim Abdelaziz Zewail, San Diego, CA (US); Zhifei Fan, San Diego, CA (US); Piyush Gupta, Bridgewater, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 18/787,492

(22) Filed: Jul. 29, 2024

(65) Prior Publication Data

US 2026/0032025 A1     Jan. 29, 2026

(51) Int. Cl.
| | |
|---|---|
| *H04L 25/49* | (2006.01) |
| *H03M 5/12* | (2006.01) |
| *H04L 5/00* | (2006.01) |

(52) U.S. Cl.
CPC .......... *H04L 25/4904* (2013.01); *H03M 5/12* (2013.01); *H04L 5/0048* (2013.01); *H04L 5/0055* (2013.01)

(58) Field of Classification Search
CPC . H04L 25/4904; H04L 5/0048; H04L 5/0055; H03M 5/12
USPC ......................................................... 375/262
See application file for complete search history.

(56) References Cited

U.S. PATENT DOCUMENTS

| | | | |
|---|---|---|---|
| 2022/0210250 A1* | 6/2022 | Chandrasekher | ....... H04L 69/22 |
| 2025/0219775 A1* | 7/2025 | Fouad | .................. H04L 5/0044 |

OTHER PUBLICATIONS

Huawei, et al., "Physical Channels and Signals for Ambient IoT", 3GPP Draft; R1-2400117; Type Discussion; FS_Ambient_IOT_Solutions, 3rd Generation Partnership Project, Mobile Competence Centre, 650, Route Des Lucioles, F-06921, Sophia-Antipolis Cedex, France, vol. RAN WG1, No. Athens, GR; Feb. 26, 2024-Mar. 1, 2024, Feb. 19, 2024, XP052567903, 15 Pages.

Infineon: "Tire Pressure Monitoring Sensor SP40PLUS Data Sheet", May 14, 2020, pp. 1-72, XP093239026, sections 5.10.1, 5.11 figure 14 p. 53.

International Search Report and Written Opinion—PCT/US2025/035059—ISA/EPO—Oct. 27, 2025.

Liu R., et al., "An 802.11ba-Based Wake-Up Radio Receiver With Wi-Fi Transceiver Integration", IEEE Journal of Solid-state Circuits, IEEE, USA, vol. 55, No. 5, Dec. 24, 2019, pp. 1151-1164, XP011784798, figures 1,2,4,6,9 p. 2, right-hand column p. 3, left-hand column.

* cited by examiner

*Primary Examiner* — Fitwi Y Hailegiorgis
(74) *Attorney, Agent, or Firm* — Holland & Hart LLP

(57)     ABSTRACT

A device may receive signaling that includes a preamble having a first subset of bits of the set of bits and a payload having a second subset of bits. In some examples, the second subset of bits may be encoded according to a Manchester encoding scheme. The second subset of bits may include fewer bits than the first subset of bits. In some examples, less than a threshold quantity of bits of the first subset of bits includes a same bit value, and each bit of the threshold quantity of bits is consecutive. The device may detect the preamble of the received signaling, and decode the payload of the received signaling including the second subset of bits (e.g., Manchester encoded subset of bits) in response to the detected preamble of the received signaling.

20 Claims, 13 Drawing Sheets

Sequence Component

1025

Signal Component

1030

1020

1000

130

105

115

Network
Entity

Transceiver

1110

Antenna

1115

Communications
Manager

1120

Memory

Code

1130

1125

1140

Processor

1135

1105

1100

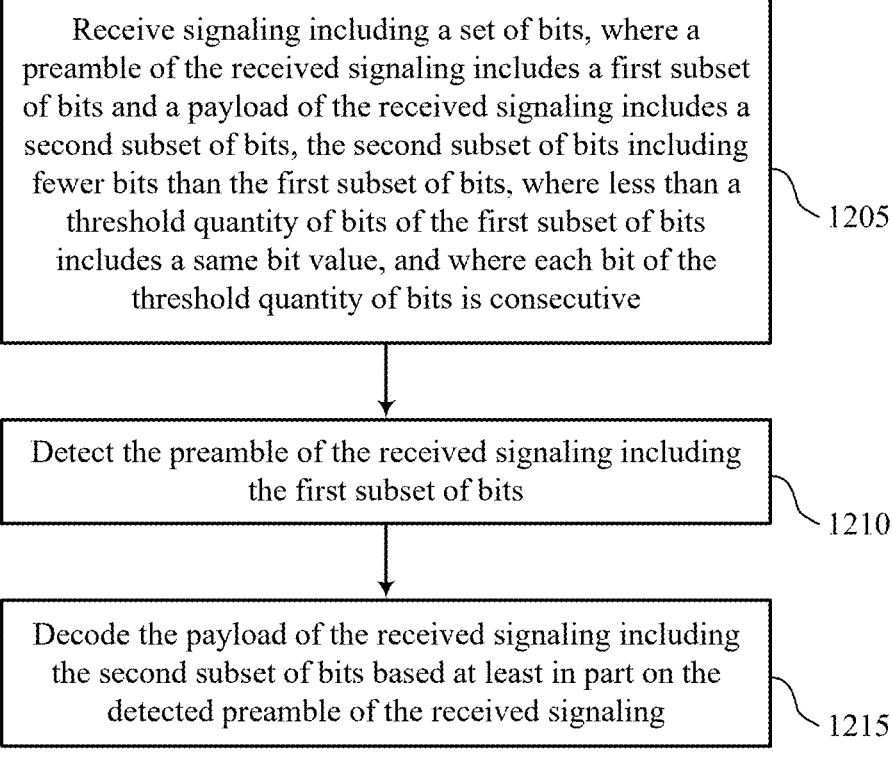

Receive signaling including a set of bits, where a preamble of the received signaling includes a first subset of bits and a payload of the received signaling includes a second subset of bits, the second subset of bits including fewer bits than the first subset of bits, where less than a threshold quantity of bits of the first subset of bits includes a same bit value, and where each bit of the threshold quantity of bits is consecutive

1205

Detect the preamble of the received signaling including the first subset of bits

1210

Decode the payload of the received signaling including the second subset of bits based at least in part on the detected preamble of the received signaling

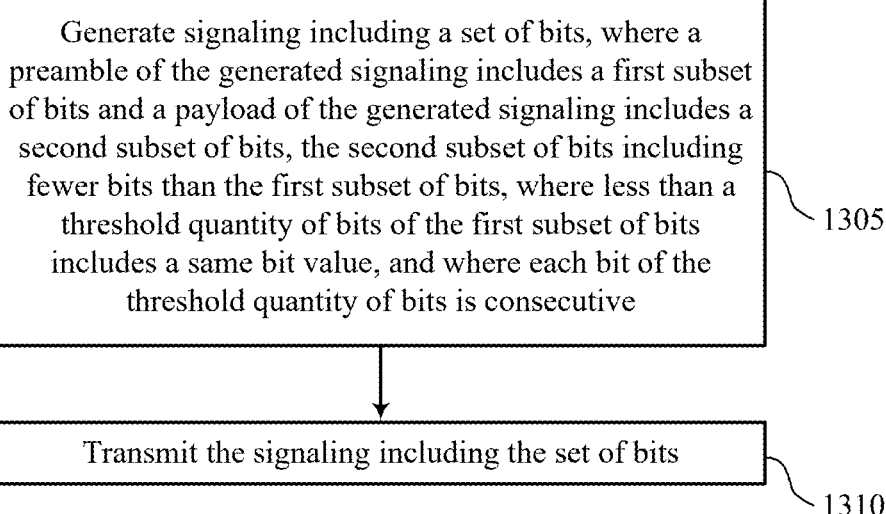

Generate signaling including a set of bits, where a preamble of the generated signaling includes a first subset of bits and a payload of the generated signaling includes a second subset of bits, the second subset of bits including fewer bits than the first subset of bits, where less than a threshold quantity of bits of the first subset of bits includes a same bit value, and where each bit of the threshold quantity of bits is consecutive

1305

Transmit the signaling including the set of bits

PREAMBLE DESIGN FOR AMBIENT-INTERNET OF THINGS

TECHNICAL FIELD

The following relates to wireless communication, including preamble design for ambient-internet of things (A-IoT).

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The systems, methods, and devices of this disclosure each have several innovative aspects, no single one of which is solely responsible for the desirable attributes disclosed herein.

A method for wireless communications by a device is described. The method may include receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive, detecting the preamble of the received signaling including the first subset of bits, and decoding the payload of the received signaling including the second subset of bits based on the detected preamble of the received signaling.

A device for wireless communications is described. The device may include one or more memories storing processor executable code, and one or more processors coupled with (e.g., operatively, communicatively, functionally, electronically, or electrically) the one or more memories. The one or more processors may individually or collectively be operable to execute the code (e.g., directly, indirectly, after pre-processing, without pre-processing) to cause the device to receive signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive, detect the preamble of the received signaling including the first subset of bits, and decode the payload of the received signaling including the second subset of bits based on the detected preamble of the received signaling.

Another device for wireless communications is described. The device may include means for receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive, means for detecting the preamble of the received signaling including the first subset of bits, and means for decoding the payload of the received signaling including the second subset of bits based on the detected preamble of the received signaling.

A non-transitory computer-readable medium storing code for wireless communications is described. The code may include instructions executable by one or more processors (e.g., directly, indirectly, after pre-processing, without pre-processing) to receive signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive, detect the preamble of the received signaling including the first subset of bits, and decode the payload of the received signaling including the second subset of bits based on the detected preamble of the received signaling.

In some examples of the method, devices, and non-transitory computer-readable medium described herein, the payload of the received signaling including the second subset of bits may be encoded according to a Manchester encoding scheme.

In some examples of the method, devices, and non-transitory computer-readable medium described herein, the payload of the received signaling including the second subset of bits may be decoded according to a Manchester decoding scheme.

In some examples of the method, devices, and non-transitory computer-readable medium described herein, a first quantity of bits of the first subset of bits may be associated with a default symbol duration.

In some examples of the method, devices, and non-transitory computer-readable medium described herein, the signaling includes an on-off keying (OOK) waveform, the set of bits includes a set of OOK bits, and a quantity of OOK symbols associated with the set of OOK bits corresponds to a quantity of orthogonal frequency division multiplexing (OFDM) symbols.

In some examples of the method, devices, and non-transitory computer-readable medium described herein, a length of the preamble may be a less than a corresponding length of a shortest OFDM symbol duration associated with the quantity of OFDM symbols and the length of the preamble corresponds to a first quantity of bits of the first subset of bits.

In some examples of the method, devices, and non-transitory computer-readable medium described herein, a length of the preamble may be a greater than a corresponding length of a longest OFDM symbol duration associated with the quantity of OFDM symbols and the length of the preamble corresponds to a first quantity of bits of the first subset of bits.

In some examples of the method, devices, and non-transitory computer-readable medium described herein, the device includes an Ambient Internet-of-Things (A-IoT) device.

Some examples of the method, devices, and non-transitory computer-readable medium described herein may further include operations, features, means, or instructions for determining that an energy level of the A-IoT device satisfies a threshold value and monitoring for the preamble of the signaling based on the energy level of the A-IoT device satisfying the threshold value.

Some examples of the method, devices, and non-transitory computer-readable medium described herein may further include operations, features, means, or instructions for switching from a first mode of operation associated with the A-IoT device to a second mode of operation associated with the A-IoT device in response to the energy level of the A-IoT device satisfying the threshold value and where monitoring for the preamble of the signaling may be based on switching from the first mode of operation associated with the A-IoT device to the second mode of operation associated with the A-IoT device.

A method for wireless communications by a device is described. The method may include generating signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive and transmitting the signaling including the set of bits.

A device for wireless communications is described. The device may include one or more memories storing processor executable code, and one or more processors coupled with (e.g., operatively, communicatively, functionally, electronically, or electrically) the one or more memories. The one or more processors may individually or collectively be operable to execute the code (e.g., directly, indirectly, after pre-processing, without pre-processing) to cause the device to generate signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive and transmit the signaling including the set of bits.

Another device for wireless communications is described. The device may include means for generating signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive and means for transmitting the signaling including the set of bits.

A non-transitory computer-readable medium storing code for wireless communications is described. The code may include instructions executable by one or more processors (e.g., directly, indirectly, after pre-processing, without pre-processing) to generate signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive and transmit the signaling including the set of bits.

In some examples of the method, devices, and non-transitory computer-readable medium described herein, the payload of the transmitted signaling including the second subset of bits may be encoded according to a Manchester encoding scheme.

In some examples of the method, devices, and non-transitory computer-readable medium described herein, a first quantity of bits of the first subset of bits may be associated with a default symbol duration.

In some examples of the method, devices, and non-transitory computer-readable medium described herein, the signaling includes an OOK waveform, the set of bits includes a set of OOK bits, and a quantity of OOK symbols associated with the set of OOK bits corresponds to a quantity of OFDM symbols.

In some examples of the method, devices, and non-transitory computer-readable medium described herein, a length of the preamble may be a less than a corresponding length of a shortest OFDM symbol duration associated with the quantity of OFDM symbols and the length of the preamble corresponds to a first quantity of bits of the first subset of bits.

In some examples of the method, devices, and non-transitory computer-readable medium described herein, a length of the preamble may be a greater than a corresponding length of a longest OFDM symbol duration associated with the quantity of OFDM symbols and the length of the preamble corresponds to a first quantity of bits of the first subset of bits.

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 12 and 13 show flowcharts illustrating methods that support preamble design for A-IoT in accordance with one or more aspects of the present disclosure.

DETAILED DESCRIPTION

Figure 1:
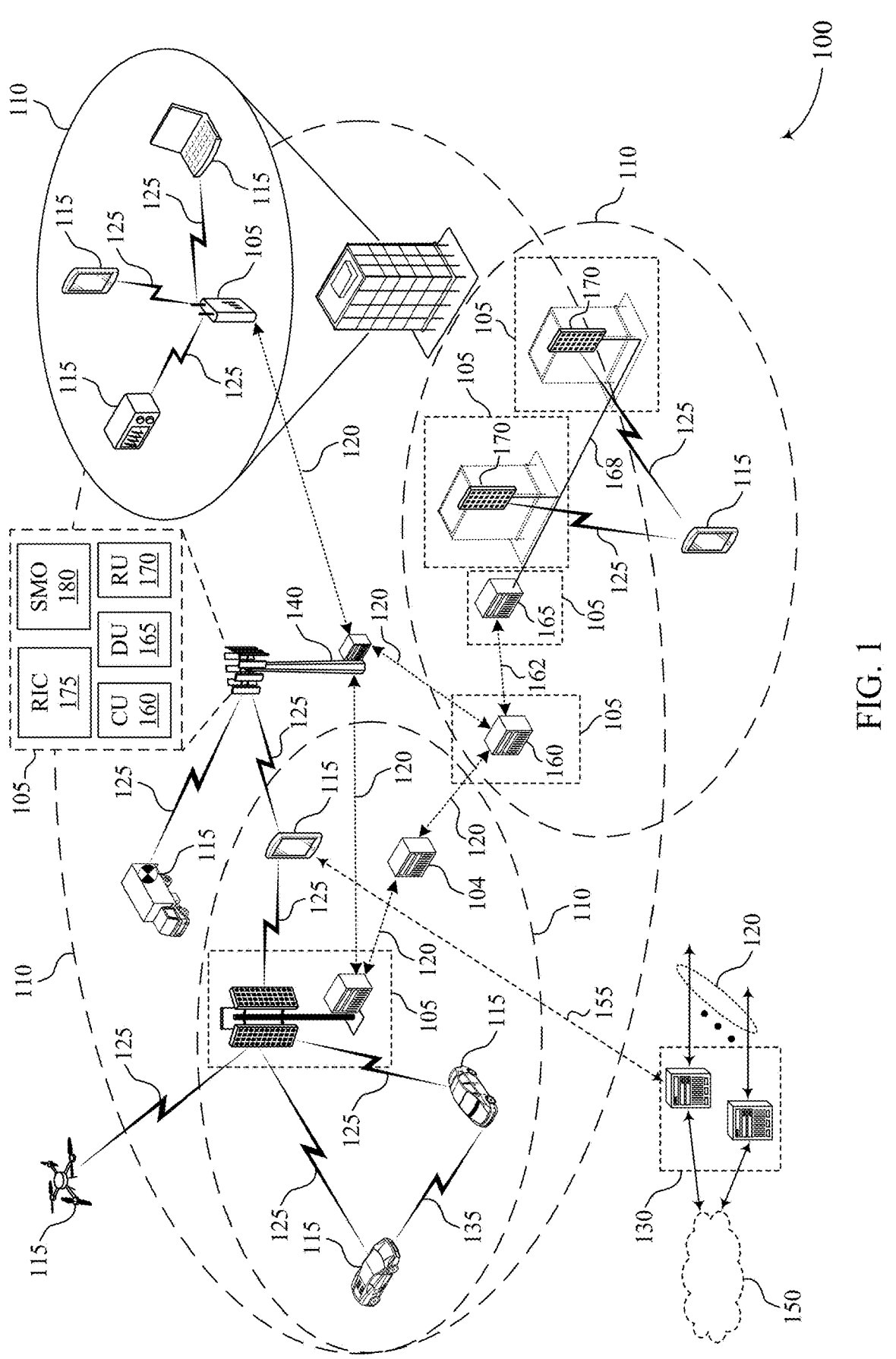
FIGS. 1 and 2 show examples of wireless communications systems that support preamble design for A-IoT in accordance with one or more aspects of the present disclosure.

One or more network entities may be capable of, configured to, or operable to support reading information from or writing information to be stored on Internet of Things (IoT) devices, such as Ambient-IoT (A-IoT) devices. In some cases, local clocks of the A-IoT devices may have unreliable accuracy because the A-IoT devices may be deployed with relatively less-expensive or lower-precision components. For example, the A-IoT devices might use analog oscillating circuits rather than a more accurate crystal oscillator to generate clock signals to reduce cost. As such, timing and synchronization capabilities of the A-IoT devices may be limited, leading to potential errors in time-sensitive applications. In some cases, the A-IoT devices may rely on a preamble of a signal to obtain an initial timing estimate and for decoding of a payload (e.g., data) of the signal. Although the use of the preamble may generally be effective for synchronizing and decoding of the payload (e.g., data), there may be scenarios in which a sequence of bits of the payload may be similar to or the same as a sequence of bits of the preamble, resulting in erroneous detection of preambles and failed decoding of the payload.

By way of example, an A-IoT device may begin searching for a preamble whenever the A-IoT device harvests sufficient energy (e.g., greater than or equal to an energy threshold). That is, the A-IoT device may wake up at any time after harvesting sufficient energy to perform one or more operations (e.g., transmitting, receiving, reflecting, backscattering). For example, the A-IoT device may wake up and receive signaling including a set of bits (e.g., a sequence of bits), where a preamble of the received signaling includes a first subset of bits of the set of bits and a payload of the received signaling includes a second subset of bits. The second subset of bits may be encoded according to a Manchester encoding scheme.

In some cases, if the second subset of bits contain portions similar to the first subset of bits (e.g., the preamble), the A-IoT device may be misaligned in decoding the second subset of bits, resulting in a high rate of failed decoding and significant power consumption. To mitigate the misalignment, the first subset of bits (e.g., the preamble) may be distinct from any Manchester encoded bits (e.g., data sequence), thereby reducing the likelihood of failed or incorrect decoding of encoded bits. As a result, the A-IoT device may experience power saving. For example, the second subset of bits may include fewer bits than the first subset of bits, where less than a threshold quantity of bits of the first subset of bits include a same bit value, and where each bit of the threshold quantity of bits is consecutive. That is, the preamble may violate any possible Manchester encoded data. For instance, for Manchester encoded data, the preamble cannot have three consecutive zeros ('0') or ones ('1').

Accordingly, generating a preamble that violates (e.g., does not match or is different from) one or more possible Manchester encoded payloads (e.g., one or more possible subsets of Manchester encoded bits) may help mitigate scenarios in which the A-IoT device detects a portion of the possible Manchester encoded payloads and mistakenly identifies these detected portions as the preamble. This approach would also reduce the likelihood of failed decoding of the possible Manchester encoded payloads by the A-IoT device due to incorrect detection of the preamble.

Aspects of the disclosure are initially described in the context of wireless communications systems. Aspects of the disclosure are further illustrated by and described with reference to apparatus diagrams, system diagrams, and flowcharts that relate to preamble design for A-IoT.

FIG. 1 shows an example of a wireless communications system 100 that supports preamble design for A-IoT in accordance with one or more aspects of the present disclosure. The wireless communications system 100 may include one or more devices, such as one or more network devices (e.g., network entities 105), one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via communication link(s) 125 (e.g., a radio frequency (RF) access link). For example, a network entity 105 may support a coverage area 110 (e.g., a geographic coverage area) over which the UEs 115 and the network entity 105 may establish the communication link(s) 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices in the wireless communications system 100 (e.g., other wireless communication devices, including UEs 115 or network entities 105), as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with a core network 130, or with one another, or both. For example, network entities 105 may communicate with the core network 130 via backhaul communication link(s) 120 (e.g., in accordance with an S1, N2, N3, or other interface protocol). In some examples, network entities 105 may communicate with one another via backhaul communication link(s) 120 (e.g., in accordance with an X2, Xn, or other interface protocol) either directly (e.g., directly between network entities 105) or indirectly (e.g., via the core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication link(s) 120, midhaul communication links 162, or fronthaul communication links 168 may be or include one or more wired links (e.g., an electrical link, an optical fiber link) or one or more wireless links (e.g., a radio link, a wireless optical link), among other examples or various combinations thereof. A UE 115 may communicate with the core network 130 via a communication link 155.

One or more of the network entities 105 or network equipment described herein may include or may be referred to as a base station 140 (e.g., a base transceiver station, a radio base station, an NR base station, an access point, a radio transceiver, a NodeB, an eNodeB (eNB), a next-generation NodeB or giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within one network entity (e.g., a network entity 105 or a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among multiple network entities (e.g., network entities 105), such as an integrated access and backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU), such as a CU 160, a distributed unit (DU), such as a DU 165, a radio unit (RU), such as an RU 170, a RAN Intelligent Controller (RIC), such as an RIC 175 (e.g., a Near-Real Time RIC (Near-RT RIC), a Non-Real Time RIC (Non-RT RIC)), a Service Management and Orchestration (SMO) system, such as an SMO system 180, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more of the network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, or any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaptation protocol (SDAP), Packet Data Convergence Protocol (PDCP)). The CU 160 (e.g., one or more CUs) may be connected to a DU 165 (e.g., one or more DUs) or an RU 170 (e.g., one or more RUs), or some combination thereof, and the DUs 165, RUs 170, or both may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or multiple different RUs, such as an RU 170). In some cases, a functional split between a CU 160 and a DU 165 or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to a DU 165 via a midhaul communication link 162 (e.g., F1, F1-c, F1-u), and a DU 165 may be connected to an RU 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities (e.g., one or more of the network entities 105) that are in communication via such communication links.

In some wireless communications systems (e.g., the wireless communications system 100), infrastructure and spectral resources for radio access may support wireless backhaul link capabilities to supplement wired backhaul connections, providing an IAB network architecture (e.g., to a core network 130). In some cases, in an IAB network, one or more of the network entities 105 (e.g., network entities 105 or IAB node(s) 104) may be partially controlled by each other. The IAB node(s) 104 may be referred to as a donor entity or an IAB donor. A DU 165 or an RU 170 may be partially controlled by a CU 160 associated with a network entity 105 or base station 140 (such as a donor network entity or a donor base station). The one or more donor entities (e.g., IAB donors) may be in communication with one or more additional devices (e.g., IAB node(s) 104) via supported access and backhaul links (e.g., backhaul communication link(s) 120). IAB node(s) 104 may include an IAB mobile termination (IAB-MT) controlled (e.g., scheduled) by one or more DUs (e.g., DUs 165) of a coupled IAB donor. An IAB-MT may be equipped with an independent set of antennas for relay of communications with UEs 115 or may share the same antennas (e.g., of an RU 170) of IAB node(s) 104 used for access via the DU 165 of the IAB node(s) 104 (e.g., referred to as virtual IAB-MT (vIAB-MT)). In some examples, the IAB node(s) 104 may include one or more DUs (e.g., DUs 165) that support communication links with additional entities (e.g., IAB node(s) 104, UEs 115) within the relay chain or configuration of the access network (e.g., downstream). In such cases, one or more components of the disaggregated RAN architecture (e.g., the IAB node(s) 104 or components of the IAB node(s) 104) may be configured to operate according to the techniques described herein.

In the case of the techniques described herein applied in the context of a disaggregated RAN architecture, one or more components of the disaggregated RAN architecture may be configured to support test as described herein. For example, some operations described as being performed by a UE 115 or a network entity 105 (e.g., a base station 140) may additionally, or alternatively, be performed by one or more components of the disaggregated RAN architecture (e.g., components such as an IAB node, a DU 165, a CU 160, an RU 170, an RIC 175, an SMO system 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a multimedia/entertainment device (e.g., a radio, a MP3 player, or a video device), a camera, a gaming device, a navigation/positioning device (e.g., GNSS (global navigation satellite system) devices based on, for example, GPS (global positioning system), Beidou, GLONASS, or Galileo, or a terrestrial-based device), a tablet computer, a laptop computer, a netbook, a smartbook, a personal computer, a smart device, a wearable device (e.g., a smart watch, smart clothing, smart glasses, virtual reality goggles, a smart wristband, smart jewelry (e.g., a smart ring, a smart bracelet)), a drone, a robot/robotic device, a vehicle, a vehicular device, a meter (e.g., parking meter, electric meter, gas meter, water meter), a monitor, a gas pump, an appliance (e.g., kitchen appliance, washing machine, dryer), a location tag, a medical/healthcare device, an implant, a sensor/actuator, a display, or any other suitable device configured to communicate via a wireless or wired medium, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, vehicles, or meters, among other examples.

The UEs 115 described herein may be able to communicate with various types of devices, such as UEs 115 that may sometimes operate as relays, as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via the communication link(s) 125 (e.g., one or more access links) using resources associated with one or more carriers. The term "carrier" may refer to a set of RF spectrum resources having a defined PHY layer structure for supporting the communication link(s) 125. For example, a carrier used for the communication link(s) 125 may include a portion of an RF spectrum band (e.g., a bandwidth part (BWP)) that is operated according to one or more PHY layer channels for a given RAT (e.g., LTE, LTE-A, LTE-A Pro, NR). Each PHY layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities, such as one or more of the network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s = 1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems, such as the wireless communications system 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to UEs 115 (e.g., one or more UEs) or may include UE-specific search space sets for sending control information to a UE 115 (e.g., a specific UE).

In some examples, a network entity 105 (e.g., a base station 140, an RU 170) may be movable and therefore provide communication coverage for a moving coverage area, such as the coverage area 110. In some examples, coverage areas 110 (e.g., different coverage areas) associated with different technologies may overlap, but the coverage areas 110 (e.g., different coverage areas) may be supported by the same network entity (e.g., a network entity 105). In some other examples, overlapping coverage areas, such as a coverage area 110, associated with different technologies may be supported by different network entities (e.g., the network entities 105). The wireless communications system 100 may include, for example, a heterogeneous network in which different types of the network entities 105 support communications for coverage areas 110 (e.g., different coverage areas) using the same or different RATs.

Some UEs 115, such as MTC or IoT devices, may be relatively low cost or low complexity devices and may provide for automated communication between machines (e.g., via Machine-to-Machine (M2M) communication). M2M communication or MTC may refer to data communication technologies that allow devices to communicate with one another or a network entity 105 (e.g., a base station 140) without human intervention. In some examples, M2M communication or MTC may include communications from devices that integrate sensors or meters to measure or capture information and relay such information to a central server or application program that uses the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging. In an aspect, techniques disclosed herein may be applicable to MTC or IoT UEs. MTC or IoT UEs may include MTC/enhanced MTC (eMTC, also referred to as CAT-M, Cat M1) UEs, NB-IoT (also referred to as CAT NB1) UEs, as well as other types of UEs. eMTC and NB-IoT may refer to future technologies that may evolve from or may be based on these technologies. For example, eMTC may include FeMTC (further eMTC), eFeMTC (enhanced further eMTC), and mMTC (massive MTC), and NB-IoT may include eNB-IoT (enhanced NB-IoT), and FeNB-IoT (further enhanced NB-IoT).

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs (e.g., one or more of the UEs 115) via a device-to-device (D2D) communication link, such as a D2D communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to one or more of the UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than one hundred kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) RAT, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

The wireless communications system 100 may be a packet-based network that operates according to a layered protocol stack. In the user plane, communications at the bearer or PDCP layer may be IP-based. An RLC layer may perform packet segmentation and reassembly to communicate via logical channels. A MAC layer may perform priority handling and multiplexing of logical channels into transport channels. The MAC layer also may implement error detection techniques, error correction techniques, or both to support retransmissions to improve link efficiency. In the control plane, an RRC layer may provide establishment, configuration, and maintenance of an RRC connection between a UE 115 and a network entity 105 or a core network 130 supporting radio bearers for user plane data. A PHY layer may map transport channels to physical channels.

The UEs 115 and the network entities 105 may support retransmissions of data to increase the likelihood that data is received successfully. Hybrid automatic repeat request (HARQ) feedback is one technique for increasing the likelihood that data is received correctly via a communication link (e.g., the communication link(s) 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in relatively poor radio conditions (e.g., low signal-to-noise conditions). In some examples, a device may support same-slot HARQ feedback, in which case the device may provide HARQ feedback in a specific slot for data received via a previous symbol in the slot. In some other examples, the device may provide HARQ feedback in a subsequent slot, or according to some other time interval.

The wireless communication system 100 may support radio frequency (RF) identification (RFID) technology, which may use radio waves to detect entities (e.g., devices or objects) in the wireless communication system 100. An RFID transmitter may be operated without a battery and at low operating expenses, low maintenance cost, and have a long-life term. A passive RFID transmitter may harvest energy over air and power transmission/reception circuitry of the passive RFID transmitter, where an emitted signal may be backscatter-modulated in the wireless communication system 100. Additionally, or alternatively, the wireless communication system 100 may deploy one or more semi-passive or active RFID transmitters with battery.

In some examples, the wireless communication system 100 may be a public network or a private network, which may deploy RFID technology for asset management of entities, such as IoT, sensors, among other examples. An RFID transmitter (also referred to as an RFID tag) may consist of circuitry (e.g., one or more transponders, antennas), which may be configured to emit a signal that includes information about the RFID transmitter and/or an entity (e.g., a UE 115) associated (e.g., equipped) with the RFID transmitter. In some examples, the emitted signal may be a backscatter modulated signal, which an RFID receiver (also referred to as an RFID reader) may receive and identify the information about the RFID transmitter and/or the entity (e.g., a UE 115) associated (e.g., equipped) with the RFID transmitter.

As radio access technologies, such as 5G expand to more industrial verticals beyond enhanced mobile broadband (eMBB), such as ultra-reliable low latency communications (URLLC) and massive machine type communications (MTC), some wireless communication system may support passive IoT. In some cases, these wireless communication systems may support MTC/Narrowband IoT (NB-IoT) and reduced capability (RedCap) for MTC use cases. However, some wireless communication system might be unable to efficiently support pervasive RFID-type sensors (e.g., passive IoT devices) in other use cases, such as asset management, logistics, warehousing, and manufacturing. As such, these wireless communication systems might have to be enhanced to manage passive IoT devices.

In the example of FIG. 1, one or more network entities 105 or base stations 140 may be capable of, configured to, or operable to support reading/writing information stored on passive IoT devices (e.g., UEs 115). In some examples, one or more network entities 105 or base stations 140 may be capable of, configured to, or operable to support providing energy to the passive IoT devices (e.g., UEs 115). Signaling provided by the passive IoT devices (e.g., UEs 115) to the one or more network entities 105 or base stations 140 may be reflected (e.g., backscatter modulated). The one or more network entities 105 or base stations 140 may read the reflected signal by the passive IoT devices (e.g., UEs 115) to decode the information transmitted by the passive IoT devices (e.g., UEs 115). Some examples of passive IoT devices may include an A-IoT device.

In some cases, a local clock of an A-IoT device may be expected to be highly inaccurate because the A-IoT device may be deployed with inexpensive technologies. Additionally, the A-IoT device might not be configured with a crystal oscillator, which provides a stable clock signal. As such, timing and synchronization capabilities of the A-IoT device may be limited, leading to potential errors in time-sensitive applications. In some cases, prior to calibration, the local clock of the A-IoT device may have an error of up to 10%. Additionally, the A-IoT device may operate according to an asynchronous mode, in which the A-IoT device functions without relying on a synchronized clock signal shared with other devices (e.g., one or more network entities 105, UEs 115, or base stations 140). As such, the A-IoT device in asynchronous mode operates independently, using its own internal clock for timing and coordination. The A-IoT device may rely on a preamble to obtain an initial timing estimate.

The A-IoT device may use a preamble of a signal transmitted, for example, by one or more network entities 105, UEs 115, or base stations 140 at a beginning of a signal sequence to synchronize an internal clock of the A-IoT device. The preamble provides a known reference point that the A-IoT device can detect and use to align the timing with one or more network entities 105, UEs 115, or base stations 140. By detecting the preamble, the A-IoT device can adjust a timing, improving synchronization for the subsequent data exchange. That is, the preamble of the signal, which is used for synchronization in the wireless communication system 100, may be defined to start with a marker (e.g., a start indicator) that indicates a beginning of the preamble. Following the start indicator, a portion of the signal may be dedicated to clock acquisition, and the A-IoT device may use this part of the signal to adjust an internal clock of the A-IoT device and synchronize with the timing of one or more network entities 105, UEs 115, or base stations 140, as well as decoding of a payload. Although the use of the preamble may generally be effective for decoding of the payload (e.g., data), there may be scenarios in which a sequence of bits of the payload may be similar to or the same as a sequence of bits of the preamble, resulting in erroneous detection of preambles and failed decoding of the payload.

Figure 2:
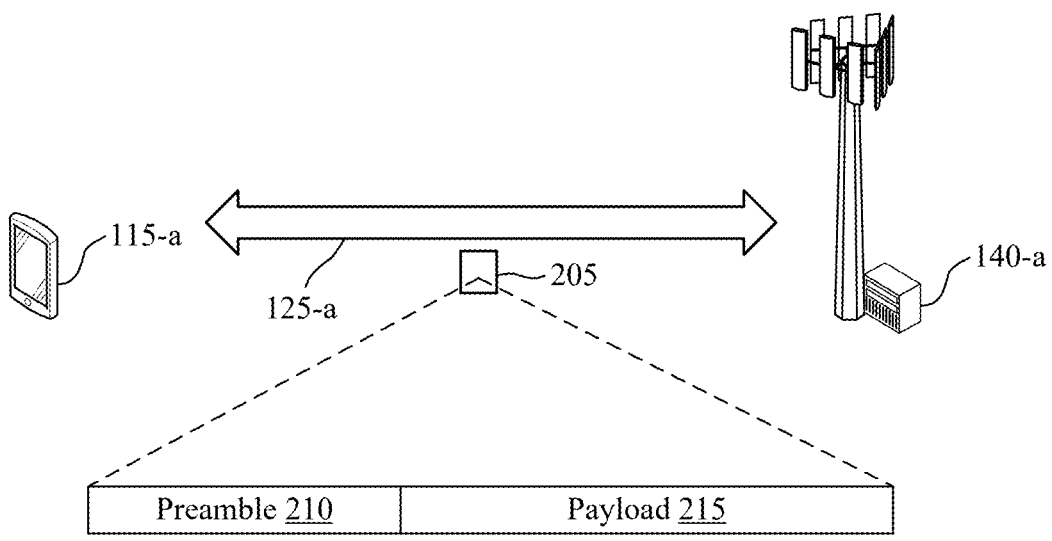

FIG. 2 shows an example of a wireless communication system 200 that supports preamble design for A-IoT in accordance with one or more aspects of the present disclosure. In some examples, the wireless communication system 200 may implement or be implemented by aspects of the wireless communications system 100 as described herein with reference to FIG. 1. For example, the wireless communication system 200 may include a UE 115-*a* and a base station 140-*a*, which may be an example of UEs 115 and base stations 140 as described herein with reference to FIG. 1. The wireless communication system 200 may support 4G, 5G, or radio access technologies beyond 5G.

The UE 115-*a* and the base station 140-*a* may perform wireless communication (e.g., one or more of receiving, obtaining, transmitting, or outputting one or more of control information or data) via a communication link 125-*a*, which may be examples of communications links 125 as described herein with reference to FIG. 1. Additionally, or alternatively, the UE 115-*a* and the base station 140-*a* may perform wireless communication (e.g., one or more of receiving, obtaining, transmitting, or outputting one or more of control information or data) via a communication link 125-*a*, which may be examples of communications links 125 as described herein with reference to FIG. 1.

In the example of FIG. 2, the UE 115-*a* may be an A-IoT device and begin searching for a preamble whenever the UE 115-*a* harvests sufficient energy (e.g., greater than or equal to an energy threshold). That is, the UE 115-*a* may wake up at any time after harvesting sufficient energy to perform one or more operations (e.g., transmitting, receiving, reflecting, backscattering). For example, the UE 115-*a* may wake up and receive signaling 205 including a set of bits (e.g., a sequence of bits), where a preamble 210 of the received signaling 205 includes a first subset of bits of the set of bits and a payload 215 of the received signaling 205 includes a second subset of bits. The second subset of bits may be encoded according to a Manchester encoding scheme.

In some cases, if the second subset of bits contain portions similar to the first subset of bits (e.g., the preamble 210), the UE 115-a may be misaligned in decoding the second subset of bits (e.g., the payload 215), resulting in a high rate of failed decoding and significant power consumption. To mitigate the misalignment, the first subset of bits (e.g., the preamble 210) may be distinct from the Manchester encoded bits (e.g., the payload 215), thereby reducing the likelihood of failed or incorrect decoding of encoded bits. As a result, the UE 115-a may experience power saving. The second subset of bits may include fewer bits than the first subset of bits, where less than a threshold quantity of bits of the first subset of bits include a same bit value, and where each bit of the threshold quantity of bits is consecutive. That is, the preamble may violate any possible Manchester encoded data. For instance, for Manchester encoded data, the preamble cannot have three consecutive zeros ('0') or ones ('1').

Figure 3:
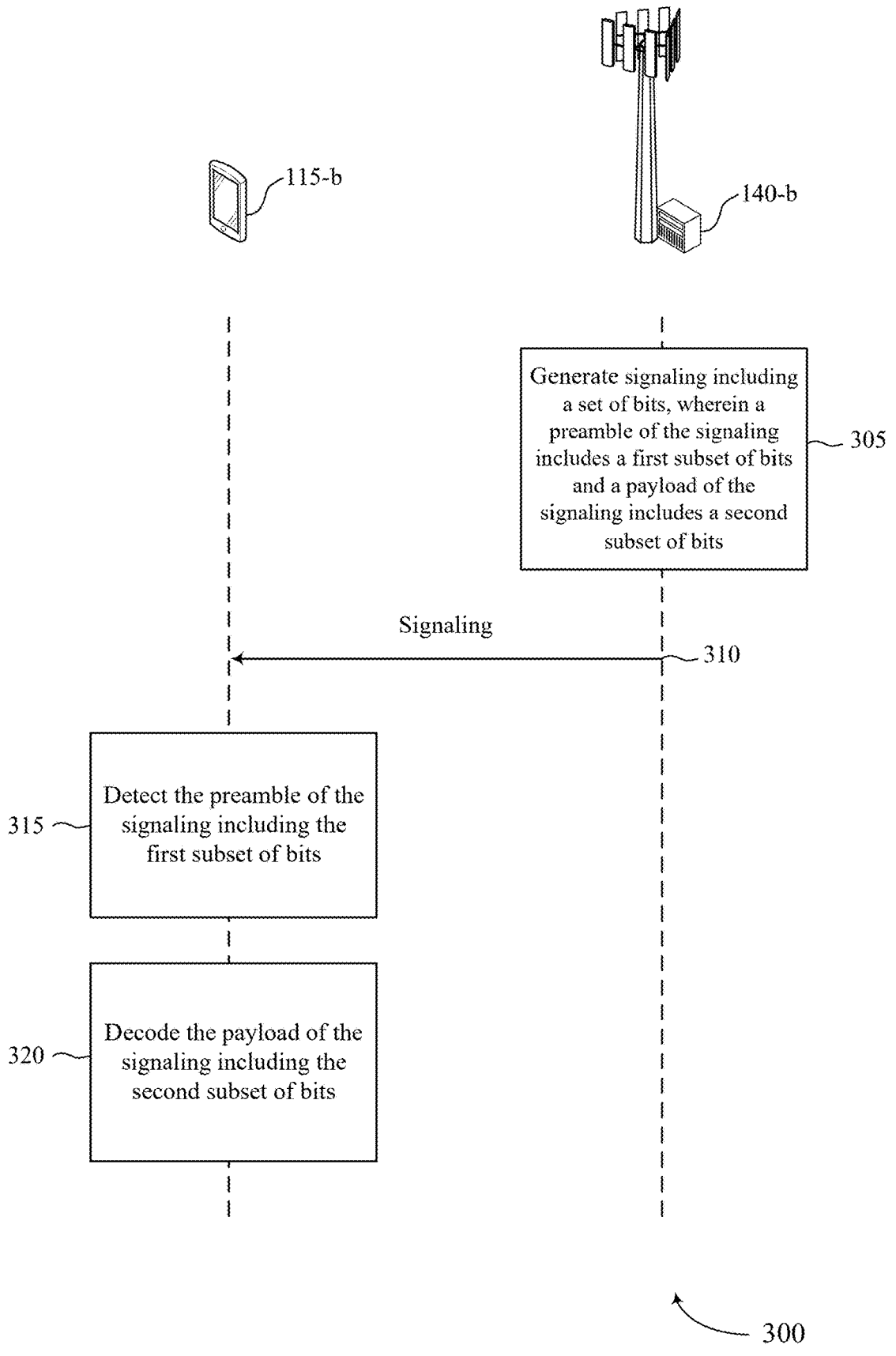
FIG. 3 shows an example of a process flow that supports preamble design for A-IoT in accordance with one or more aspects of the present disclosure.

FIG. 3 shows an example of a process flow 300 that supports preamble design for A-IoT in accordance with one or more aspects of the present disclosure. The process flow 300 may implement aspects of the wireless communications system 100 as described with reference to FIG. 1. The process flow 300 may include a UE 115-b and a base station 140-b, which may be examples of UEs 115 and base stations 140 as described herein. In the example of FIG. 3, the UE 115-b may be an A-IoT device. In the following description of the process flow 300, the operations between the UE 115-b and the base station 140-b may be transmitted in a different order than the example order shown, or the operations performed by the UE 115-b and the base station 140-b may be performed in different orders or at different times. Some operations may also be omitted from the process flow 300, and other operations may be added to the process flow 300.

At 305, the base station 140-b may generate signaling including a set of bits, wherein a preamble of the signaling includes a first subset of bits of the set of bits and a payload of the signaling includes a second subset of bits.

Prior to transmitting the signaling, the base station 140-b may encode the payload of the signaling (e.g., the second subset of bits) according to a Manchester encoding scheme. The Manchester encoding scheme allows for the UE 115-b to synchronize a clock of the UE 115-b with a clock of the base station 140-b. This ensures that the signaling is transmitted and received at a same rate, and there is no need for a separate clock signal. Additionally, the Manchester encoding scheme provides a mechanism for detecting errors in the transmitted signaling. Any change in a voltage level within a time interval indicates a bit error, which can be detected and corrected by one or more of the UE 115-b or the base station 140-b.

In accordance with various aspects of the present disclosure, the preamble of the signaling (e.g., the first subset of bits) may be generated to violate the Manchester encoded payload (e.g., the second subset of bits) of the signaling. For example, the Manchester encoded payload (e.g., the second subset of bits) may include fewer bits than the preamble (e.g., the first subset of bits). In some examples, less than a threshold quantity of bits of the preamble (e.g., the first subset of bits) may include a same bit value (e.g., '0' or '1'). Additionally, each bit of the threshold quantity of bits is consecutive. As such, for the Manchester encoded payload (e.g., the second subset of bits), the payload cannot have three or more consecutive '0' or '1'.

In some examples, the preamble of the signaling (e.g., the first subset of bits) may have a static (e.g., fixed) duration, while the Manchester encoded payload (e.g., the second subset of bits) may have a non-static duration. That is, the preamble of the signaling (e.g., the first subset of bits) may have a fixed duration (e.g., symbol length), while the Manchester encoded payload (e.g., the second subset of bits) may have different durations (e.g., symbol lengths, chip durations) that may be indicated by a clock acquisition part of the signaling. In some examples, the signaling may be on-off keying (OOK) waveform, where the set of bits includes a set of OOK bits.

The Manchester encoded payload (e.g., the second subset of bits) may be generated by the base station 140-b using an OOK-4 modulation scheme with M of OOK symbols per OFDM symbols. One or more of the UE 115-b or the base station 140-b may determine the value of M via the clock acquisition part of the signaling. Similarly, the preamble of the signaling (e.g., the first subset of bits) may be determined by the base station 140-b such that the preamble of the signaling (e.g., the first subset of bits) may violate (e.g., not match, be different from) one or more possible Manchester encoded payload (e.g., one or more possible Manchester encoded subset of bits) for different values of M.

In some examples, for a low voltage transmission (e.g., an OFF pattern) of the preamble of the signaling (e.g., the first subset of bits), a length of the preamble may be less than a corresponding length of a shortest OFDM symbol duration (or OOK symbol duration) associated with a quantity of OFDM symbols (or a quantity of OOK symbols per OFDM symbols). Alternatively, in other examples, for a high/low voltage transmission (e.g., ON/OFF pattern) of the preamble of the signaling (e.g., the first subset of bits), a length of the preamble may be greater than a corresponding length of a longest OFDM symbol duration (or OOK symbol duration) associated with a quantity of OFDM symbols (or a quantity of OOK symbols per OFDM symbols).

For the low voltage transmission (e.g., OFF state of the ON/OFF pattern), a length of the preamble of the signaling (e.g., the first subset of bits) may be three times a length of the shortest OFDM symbol duration (or OOK symbol duration) associated with the quantity of OFDM symbols (or a quantity of OOK symbols per OFDM symbols). That is, across all values of M. Alternatively for the high voltage transmission (e.g., ON state of the ON/OFF pattern), the length of the preamble of the signaling (e.g., the first subset of bits) may be three times the longest OFDM symbol duration (or OOK symbol duration) associated with the quantity of OFDM symbols (or the quantity of OOK symbols per OFDM symbols). That is, across all values of M. By way of example, for a same symbol duration between the preamble of the signaling (e.g., the first subset of bits) and the Manchester encoded payload (e.g., the second subset of bits), the following examples of preambles (e.g., start indicators) can have almost no false decoding: '110000111', '1111010000', and '111000011'.

At 310, the base station 140-b may transmit, and the UE 115-b may receive, the signaling. In some examples, the base station 140-b may transmit the signaling according to a waveform, such as an OOK waveform. For example, the base station 140-b may perform a transmission of an OOK waveform that may carry a sequence of bits that includes the preamble (e.g., a first subset of bits) and the payload (e.g., a second subset of bits).

At 315, the UE 115-*b* may detect the preamble of the signaling including the first subset of bits. In some examples, the UE 115-*b* may determine that an energy level of the UE 115-*b* satisfies a threshold value, and monitor for the preamble of the signaling based on the energy level of the UE 115-*b* satisfying the threshold value (e.g., greater than or equal to the threshold value). For example, the UE 115-*b* may switch from a first mode of operation (e.g., a low power mode) associated with the UE 115-*b* to a second mode of operation (e.g., normal power mode) associated with the UE 115-*b* in response to the energy level of the UE 115-*b* satisfying the threshold value, and monitor for the preamble of the signaling while operating in the second mode of operation (e.g., normal power mode).

At 320, the UE 115-*b* may decode the payload of the signaling including the second subset of bits. For example, the UE 115-*b* may decode the payload of the signaling including the second subset of bits according to a Manchest decoding scheme.

Accordingly, generating a preamble that violates (e.g., does not match or is different from) one or more possible Manchester encoded payloads (e.g., one or more possible subsets of Manchester encoded bits) may help mitigate scenarios in which the UE 115-*b* detects a portion of the possible Manchester encoded payloads and mistakenly identifies these detected portions as the preamble. This approach would also reduce the likelihood of failed decoding of the possible Manchester encoded payloads by the UE 115-*b* due to incorrect detection of the preamble.

Figure 4:
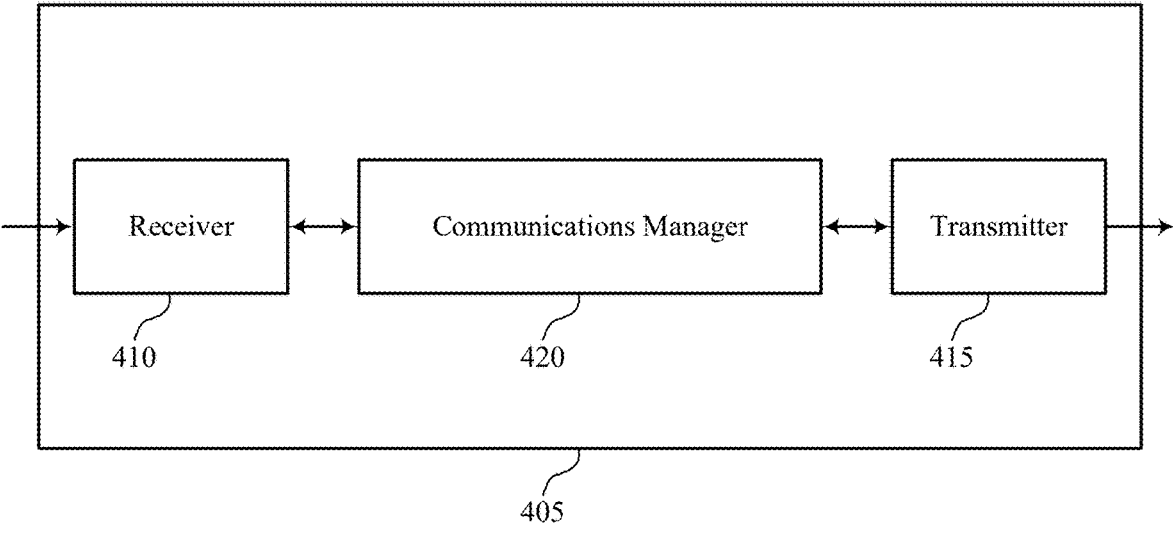
FIGS. 4 and 5 show block diagrams of devices that support preamble design for A-IoT in accordance with one or more aspects of the present disclosure.

FIG. 4 shows a block diagram 400 of a device 405 that supports preamble design for A-IoT in accordance with one or more aspects of the present disclosure. The device 405 may be an example of aspects of a UE 115 as described herein. The device 405 may include a receiver 410, a transmitter 415, and a communications manager 420. The device 405, or one or more components of the device 405 (e.g., the receiver 410, the transmitter 415, the communications manager 420), may include at least one processor, which may be coupled with at least one memory, to, individually or collectively, support or enable the described techniques. Each of these components may be in communication with one another (e.g., via one or more buses).

The receiver 410 may provide a means for receiving information such as packets, user data, control information, or any combination thereof associated with various information channels (e.g., control channels, data channels, information channels related to preamble design for A-IoT). Information may be passed on to other components of the device 405. The receiver 410 may utilize a single antenna or a set of multiple antennas.

The transmitter 415 may provide a means for transmitting signals generated by other components of the device 405. For example, the transmitter 415 may transmit information such as packets, user data, control information, or any combination thereof associated with various information channels (e.g., control channels, data channels, information channels related to preamble design for A-IoT). In some examples, the transmitter 415 may be co-located with a receiver 410 in a transceiver module. The transmitter 415 may utilize a single antenna or a set of multiple antennas.

The communications manager 420, the receiver 410, the transmitter 415, or various combinations or components thereof may be examples of means for performing various aspects of preamble design for A-IoT as described herein. For example, the communications manager 420, the receiver 410, the transmitter 415, or various combinations or components thereof may be capable of performing one or more of the functions described herein.

In some examples, the communications manager 420, the receiver 410, the transmitter 415, or various combinations or components thereof may be implemented in hardware (e.g., in communications management circuitry). The hardware may include at least one of a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 420, the receiver 410, the transmitter 415, or various combinations or components thereof may be implemented in code (e.g., as communications management software) executed by at least one processor (e.g., referred to as a processor-executable code). If implemented in code executed by at least one processor, the functions of the communications manager 420, the receiver 410, the transmitter 415, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 420 may be configured to perform various operations (e.g., receiving, obtaining, monitoring, outputting, transmitting) using or otherwise in cooperation with the receiver 410, the transmitter 415, or both. For example, the communications manager 420 may receive information from the receiver 410, send information to the transmitter 415, or be integrated in combination with the receiver 410, the transmitter 415, or both to obtain information, output information, or perform various other operations as described herein.

The communications manager 420 may support wireless communications in accordance with examples as disclosed herein. For example, the communications manager 420 is capable of, configured to, or operable to support a means for receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The communications manager 420 is capable of, configured to, or operable to support a means for detecting the preamble of the received signaling including the first subset of bits. The communications manager 420 is capable of, configured to, or operable to support a means for decoding the payload of the received signaling including the second subset of bits based on (e.g., in response to) the detected preamble of the received signaling.

By including or configuring the communications manager 420 in accordance with examples as described herein, the device 405 (e.g., at least one processor controlling or otherwise coupled with the receiver 410, the transmitter 415, the communications manager 420, or a combination thereof) may support techniques for reduced power consumption.

Figure 5:
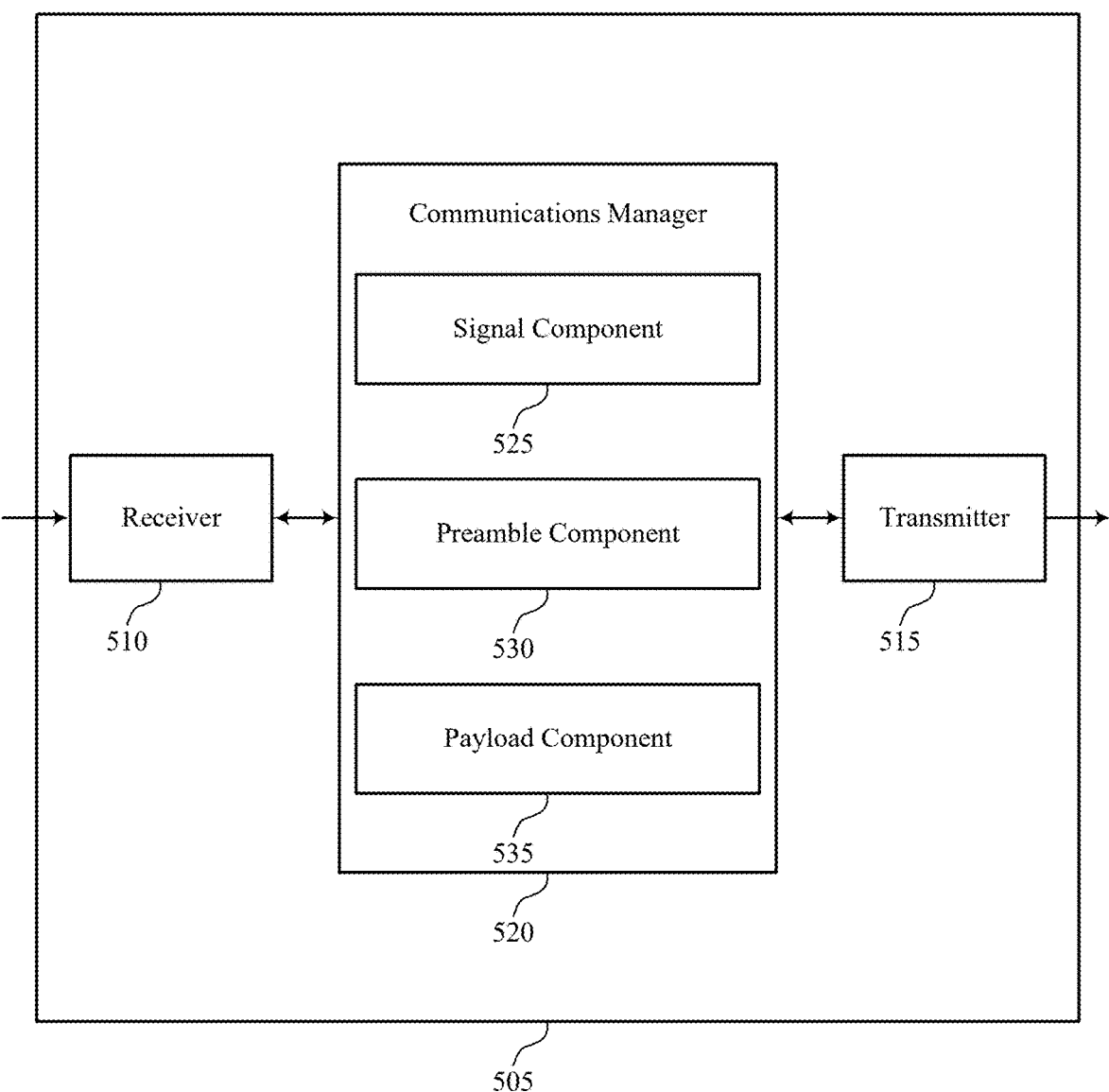

FIG. 5 shows a block diagram 500 of a device 505 that supports preamble design for A-IoT in accordance with one or more aspects of the present disclosure. The device 505 may be an example of aspects of a device 405 or a UE 115 as described herein. The device 505 may include a receiver 510, a transmitter 515, and a communications manager 520. The device 505, or one of more components of the device 505 (e.g., the receiver 510, the transmitter 515, the communications manager 520), may include at least one processor, which may be coupled with at least one memory, to support the described techniques. Each of these components may be in communication with one another (e.g., via one or more buses).

The receiver 510 may provide a means for receiving information such as packets, user data, control information, or any combination thereof associated with various information channels (e.g., control channels, data channels, information channels related to preamble design for A-IoT). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to preamble design for A-IoT). In some examples, the transmitter 515 may be co-located with a receiver 510 in a transceiver module. The transmitter 515 may utilize a single antenna or a set of multiple antennas.

The device 505, or various components thereof, may be an example of means for performing various aspects of preamble design for A-IoT as described herein. For example, the communications manager 520 may include a signal component 525, a preamble component 530, a payload component 535, or any combination thereof. The communications manager 520 may be an example of aspects of a communications manager 420 as described herein. In some examples, the communications manager 520, or various components thereof, may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications in accordance with examples as disclosed herein. The signal component 525 is capable of, configured to, or operable to support a means for receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The preamble component 530 is capable of, configured to, or operable to support a means for detecting the preamble of the received signaling including the first subset of bits. The payload component 535 is capable of, configured to, or operable to support a means for decoding the payload of the received signaling including the second subset of bits based on (e.g., in response to) the detected preamble of the received signaling.

Figure 6:
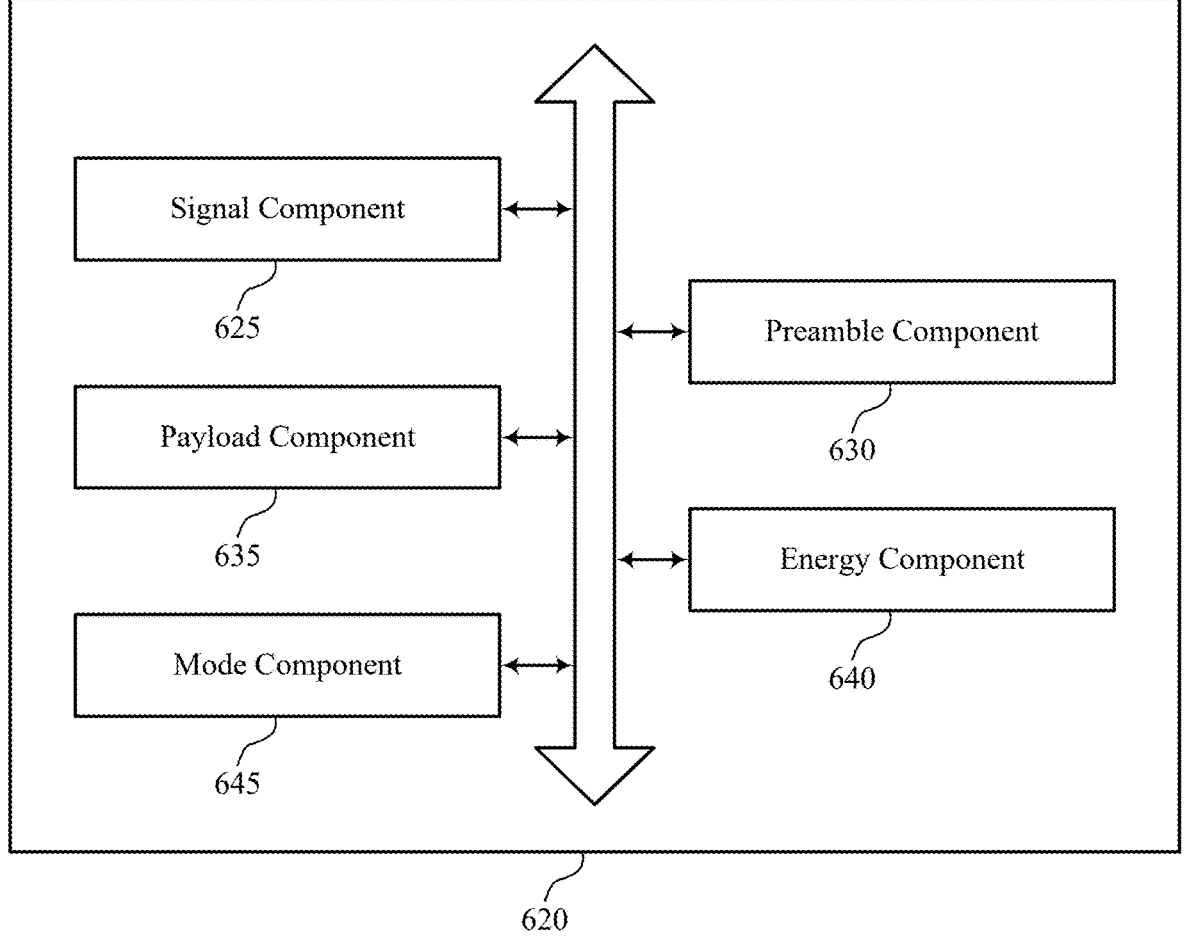
FIG. 6 shows a block diagram of a communications manager that supports preamble design for A-IoT in accordance with one or more aspects of the present disclosure.

FIG. 6 shows a block diagram 600 of a communications manager 620 that supports preamble design for A-IoT in accordance with one or more aspects of the present disclosure. The communications manager 620 may be an example of aspects of a communications manager 420, a communications manager 520, or both, as described herein. The communications manager 620, or various components thereof, may be an example of means for performing various aspects of preamble design for A-IoT as described herein. For example, the communications manager 620 may include a signal component 625, a preamble component 630, a payload component 635, an energy component 640, a mode component 645, or any combination thereof. Each of these components, or components or subcomponents thereof (e.g., one or more processors, one or more memories), may communicate, directly or indirectly, with one another (e.g., via one or more buses).

The communications manager 620 may support wireless communications in accordance with examples as disclosed herein. The signal component 625 is capable of, configured to, or operable to support a means for receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The preamble component 630 is capable of, configured to, or operable to support a means for detecting the preamble of the received signaling including the first subset of bits. The payload component 635 is capable of, configured to, or operable to support a means for decoding the payload of the received signaling including the second subset of bits based on (e.g., in response to) the detected preamble of the received signaling.

In some examples, the payload of the received signaling including the second subset of bits is encoded according to a Manchester encoding scheme. In some examples, the payload of the received signaling including the second subset of bits is decoded according to a Manchester decoding scheme. In some examples, a first quantity of bits of the first subset of bits is associated with a default symbol duration.

In some examples, the signaling includes an OOK waveform. In some examples, the set of bits includes a set of OOK bits. In some examples, a quantity of OOK symbols associated with the set of OOK bits corresponds to a quantity of OFDM symbols. In some examples, a length of the preamble is a less than a corresponding length of a shortest OFDM symbol duration associated with the quantity of OFDM symbols. In some examples, the length of the preamble corresponds to a first quantity of bits of the first subset of bits. In some examples, a length of the preamble is a greater than a corresponding length of a longest OFDM symbol duration associated with the quantity of OFDM symbols. In some examples, the length of the preamble corresponds to a first quantity of bits of the first subset of bits.

In some examples, the device includes an A-IoT device. In some examples, the energy component 640 is capable of, configured to, or operable to support a means for determining that an energy level of the A-IoT device satisfies a threshold value. In some examples, the preamble component 630 is capable of, configured to, or operable to support a means for monitoring for the preamble of the signaling based on the energy level of the A-IoT device satisfying the threshold value.

In some examples, the mode component 645 is capable of, configured to, or operable to support a means for switching from a first mode of operation associated with the A-IoT device to a second mode of operation associated with the A-IoT device in response to the energy level of the A-IoT device satisfying the threshold value. In some examples, the preamble component 630 is capable of, configured to, or operable to support a means for where monitoring for the preamble of the signaling is based on switching from the first mode of operation associated with the A-IoT device to the second mode of operation associated with the A-IoT device.

Figure 7:
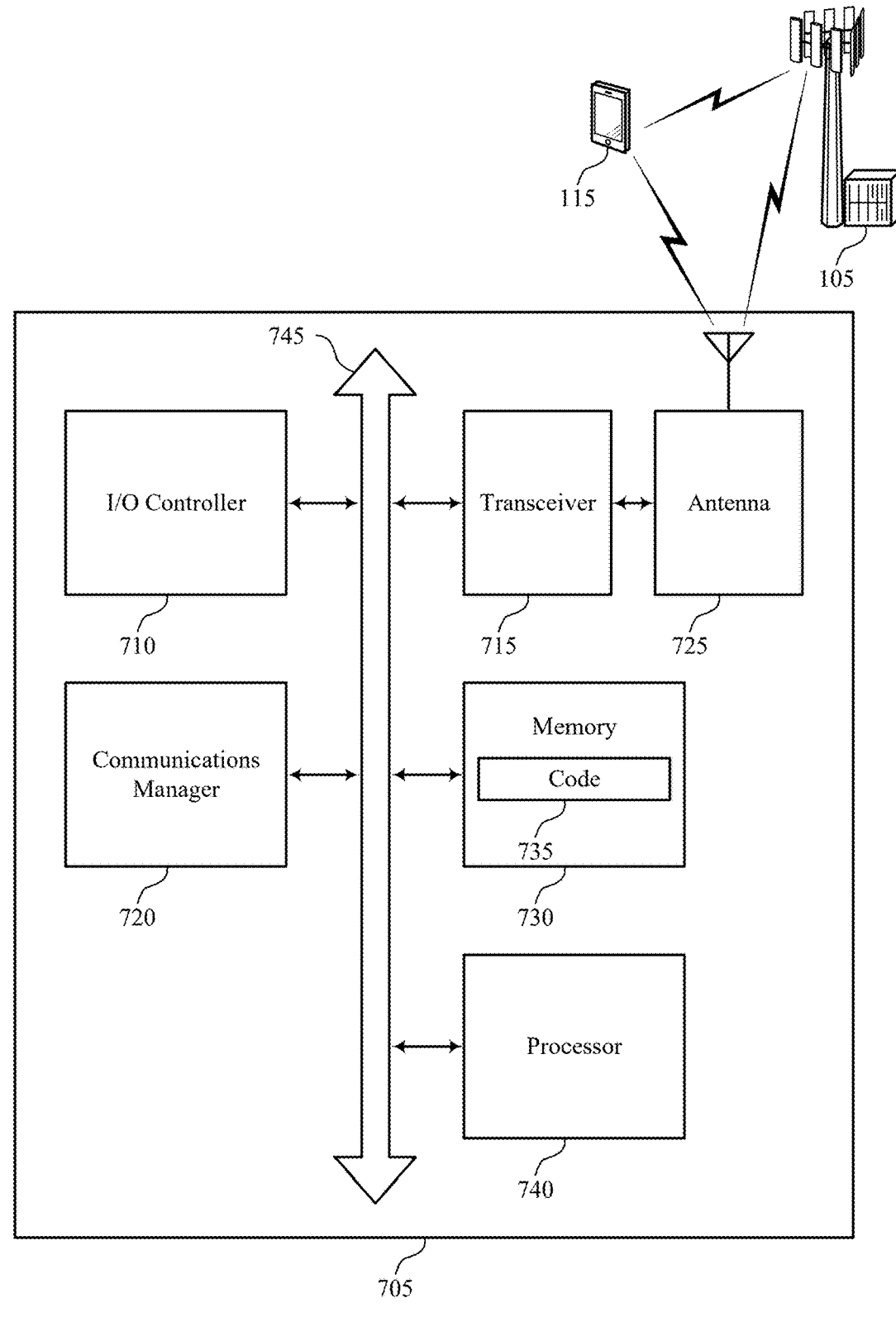
FIG. 7 shows a diagram of a system including a device that supports preamble design for A-IoT in accordance with one or more aspects of the present disclosure.

FIG. 7 shows a diagram of a system 700 including a device 705 that supports preamble design for A-IoT in accordance with one or more aspects of the present disclosure. The device 705 may be an example of or include components of a device 405, a device 505, or a UE 115 as described herein. The device 705 may communicate (e.g., wirelessly) with one or more other devices (e.g., network entities 105, UEs 115, or a combination thereof). The device 705 may include components for bi-directional voice and data communications including components for transmitting and receiving communications, such as a communications manager 720, an input/output (I/O) controller, such as an I/O controller 710, a transceiver 715, one or more antennas 725, at least one memory 730, code 735, and at least one processor 740. These components may be in electronic communication or otherwise coupled (e.g., operatively, communicatively, functionally, electronically, electrically) via one or more buses (e.g., a bus 745).

The I/O controller 710 may manage input and output signals for the device 705. The I/O controller 710 may also manage peripherals not integrated into the device 705. In some cases, the I/O controller 710 may represent a physical connection or port to an external peripheral. In some cases, the I/O controller 710 may utilize an operating system such as iOS®, ANDROID®, MS-DOS®, MS-WINDOWS®, OS/2®, UNIX®, LINUX®, or another known operating system. Additionally, or alternatively, the I/O controller 710 may represent or interact with a modem, a keyboard, a mouse, a touchscreen, or a similar device. In some cases, the I/O controller 710 may be implemented as part of one or more processors, such as the at least one processor 740. In some cases, a user may interact with the device 705 via the I/O controller 710 or via hardware components controlled by the I/O controller 710.

In some cases, the device 705 may include a single antenna. However, in some other cases, the device 705 may have more than one antenna, which may be capable of concurrently transmitting or receiving multiple wireless transmissions. The transceiver 715 may communicate bi-directionally via the one or more antennas 725 using wired or wireless links as described herein. For example, the transceiver 715 may represent a wireless transceiver and may communicate bi-directionally with another wireless transceiver. The transceiver 715 may also include a modem to modulate the packets, to provide the modulated packets to one or more antennas 725 for transmission, and to demodulate packets received from the one or more antennas 725. The transceiver 715, or the transceiver 715 and one or more antennas 725, may be an example of a transmitter 415, a transmitter 515, a receiver 410, a receiver 510, or any combination thereof or component thereof, as described herein.

The at least one memory 730 may include random access memory (RAM) and read-only memory (ROM). The at least one memory 730 may store computer-readable, computer-executable, or processor-executable code, such as the code 735. The code 735 may include instructions that, when executed by the at least one processor 740, cause the device 705 to perform various functions described herein. The code 735 may be stored in a non-transitory computer-readable medium such as system memory or another type of memory. In some cases, the code 735 may not be directly executable by the at least one processor 740 but may cause a computer (e.g., when compiled and executed) to perform functions described herein. In some cases, the at least one memory 730 may include, among other things, a basic I/O system (BIOS) which may control basic hardware or software operation such as the interaction with peripheral components or devices.

The at least one processor 740 may include one or more intelligent hardware devices (e.g., one or more general-purpose processors, one or more DSPs, one or more CPUs, one or more graphics processing units (GPUs), one or more neural processing units (NPUs) (also referred to as neural network processors or deep learning processors (DLPs)), one or more microcontrollers, one or more ASICs, one or more FPGAs, one or more programmable logic devices, discrete gate or transistor logic, one or more discrete hardware components, or any combination thereof). In some cases, the at least one processor 740 may be configured to operate a memory array using a memory controller. In some other cases, a memory controller may be integrated into the at least one processor 740. The at least one processor 740 may be configured to execute computer-readable instructions stored in a memory (e.g., the at least one memory 730) to cause the device 705 to perform various functions (e.g., functions or tasks supporting preamble design for A-IoT). For example, the device 705 or a component of the device 705 may include at least one processor 740 and at least one memory 730 coupled with or to the at least one processor 740, the at least one processor 740 and the at least one memory 730 configured to perform various functions described herein.

In some examples, the at least one processor 740 may include multiple processors and the at least one memory 730 may include multiple memories. One or more of the multiple processors may be coupled with one or more of the multiple memories, which may, individually or collectively, be configured to perform various functions described herein. In some examples, the at least one processor 740 may be a component of a processing system, which may refer to a system (such as a series) of machines, circuitry (including, for example, one or both of processor circuitry (which may include the at least one processor 740) and memory circuitry (which may include the at least one memory 730)), or components, that receives or obtains inputs and processes the inputs to produce, generate, or obtain a set of outputs. The processing system may be configured to perform one or more of the functions described herein. For example, the at least one processor 740 or a processing system including the at least one processor 740 may be configured to, configurable to, or operable to cause the device 705 to perform one or more of the functions described herein. Further, as described herein, being "configured to," being "configurable to," and being "operable to" may be used interchangeably and may be associated with a capability, when executing code 735 (e.g., processor-executable code) stored in the at least one memory 730 or otherwise, to perform one or more of the functions described herein.

The communications manager 720 may support wireless communications in accordance with examples as disclosed herein. For example, the communications manager 720 is capable of, configured to, or operable to support a means for receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The communications manager 720 is capable of, configured to, or operable to support a means for detecting the preamble of the received signaling including the first subset of bits. The communications manager 720 is capable of, configured to, or operable to support a means for decoding the payload of the received signaling including the second subset of bits based on (e.g., in response to) the detected preamble of the received signaling.

By including or configuring the communications manager 720 in accordance with examples as described herein, the device 705 may support techniques for reduced power consumption, improved coordination between devices, and longer battery life.

In some examples, the communications manager 720 may be configured to perform various operations (e.g., receiving, monitoring, transmitting) using or otherwise in cooperation with the transceiver 715, the one or more antennas 725, or any combination thereof. Although the communications manager 720 is illustrated as a separate component, in some examples, one or more functions described with reference to the communications manager 720 may be supported by or performed by the at least one processor 740, the at least one memory 730, the code 735, or any combination thereof. For example, the code 735 may include instructions executable by the at least one processor 740 to cause the device 705 to perform various aspects of preamble design for A-IoT as described herein, or the at least one processor 740 and the at least one memory 730 may be otherwise configured to, individually or collectively, perform or support such operations.

Figure 8:
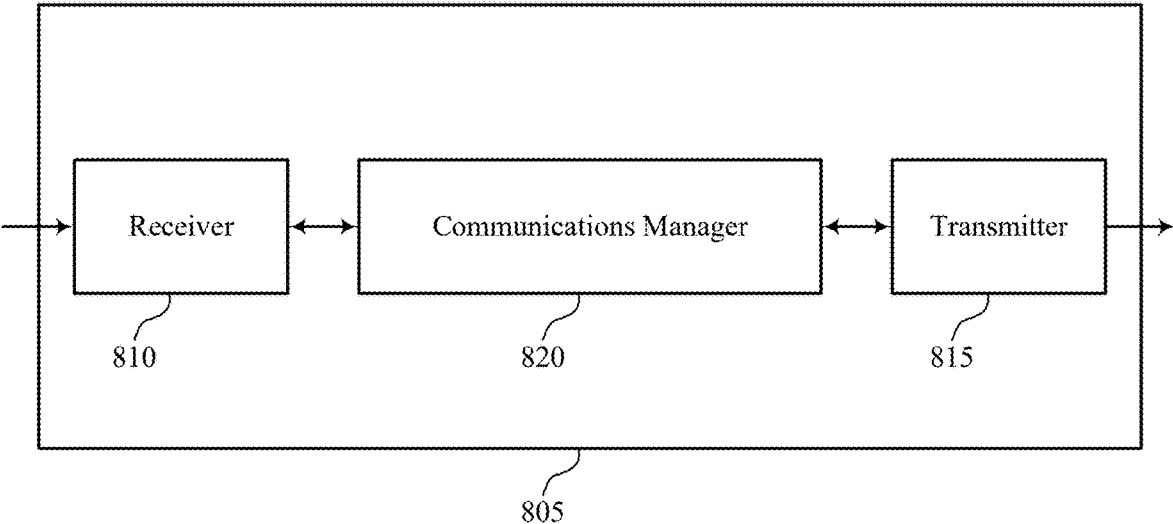
FIGS. 8 and 9 show block diagrams of devices that support preamble design for A-IoT in accordance with one or more aspects of the present disclosure.

FIG. 8 shows a block diagram 800 of a device 805 that supports preamble design for A-IoT in accordance with one or more aspects of the present disclosure. The device 805 may be an example of aspects of a network entity 105 as described herein. The device 805 may include a receiver 810, a transmitter 815, and a communications manager 820. The device 805, or one or more components of the device 805 (e.g., the receiver 810, the transmitter 815, the communications manager 820), may include at least one processor, which may be coupled with at least one memory, to, individually or collectively, support or enable the described techniques. Each of these components may be in communication with one another (e.g., via one or more buses).

The receiver 810 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 805. In some examples, the receiver 810 may support obtaining information by receiving signals via one or more antennas. Additionally, or alternatively, the receiver 810 may support obtaining information by receiving signals via one or more wired (e.g., electrical, fiber optic) interfaces, wireless interfaces, or any combination thereof.

The transmitter 815 may provide a means for outputting (e.g., transmitting, providing, conveying, sending) information generated by other components of the device 805. For example, the transmitter 815 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 815 may support outputting information by transmitting signals via one or more antennas. Additionally, or alternatively, the transmitter 815 may support outputting information by transmitting signals via one or more wired (e.g., electrical, fiber optic) interfaces, wireless interfaces, or any combination thereof. In some examples, the transmitter 815 and the receiver 810 may be co-located in a transceiver, which may include or be coupled with a modem.

The communications manager 820, the receiver 810, the transmitter 815, or various combinations or components thereof may be examples of means for performing various aspects of preamble design for A-IoT as described herein. For example, the communications manager 820, the receiver 810, the transmitter 815, or various combinations or components thereof may be capable of performing one or more of the functions described herein.

In some examples, the communications manager 820, the receiver 810, the transmitter 815, or various combinations or components thereof may be implemented in hardware (e.g., in communications management circuitry). The hardware may include at least one of a processor, a DSP, a CPU, an ASIC, an FPGA or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 820, the receiver 810, the transmitter 815, or various combinations or components thereof may be implemented in code (e.g., as communications management software) executed by at least one processor (e.g., referred to as a processor-executable code). If implemented in code executed by at least one processor, the functions of the communications manager 820, the receiver 810, the transmitter 815, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 820 may be configured to perform various operations (e.g., receiving, obtaining, monitoring, outputting, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to obtain information, output information, or perform various other operations as described herein.

The communications manager 820 may support wireless communications in accordance with examples as disclosed herein. For example, the communications manager 820 is capable of, configured to, or operable to support a means for generating signaling including a set of bits, where a preamble of the generated signaling includes a first subset of bits of the set of bits and a payload of the generated signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The communications manager 820 is capable of, configured to, or operable to support a means for transmitting the signaling including the set of bits.

By including or configuring the communications manager 820 in accordance with examples as described herein, the device 805 (e.g., at least one processor controlling or otherwise coupled with the receiver 810, the transmitter 815, the communications manager 820, or a combination thereof) may support techniques for more efficient utilization of communication resources.

Figure 9:
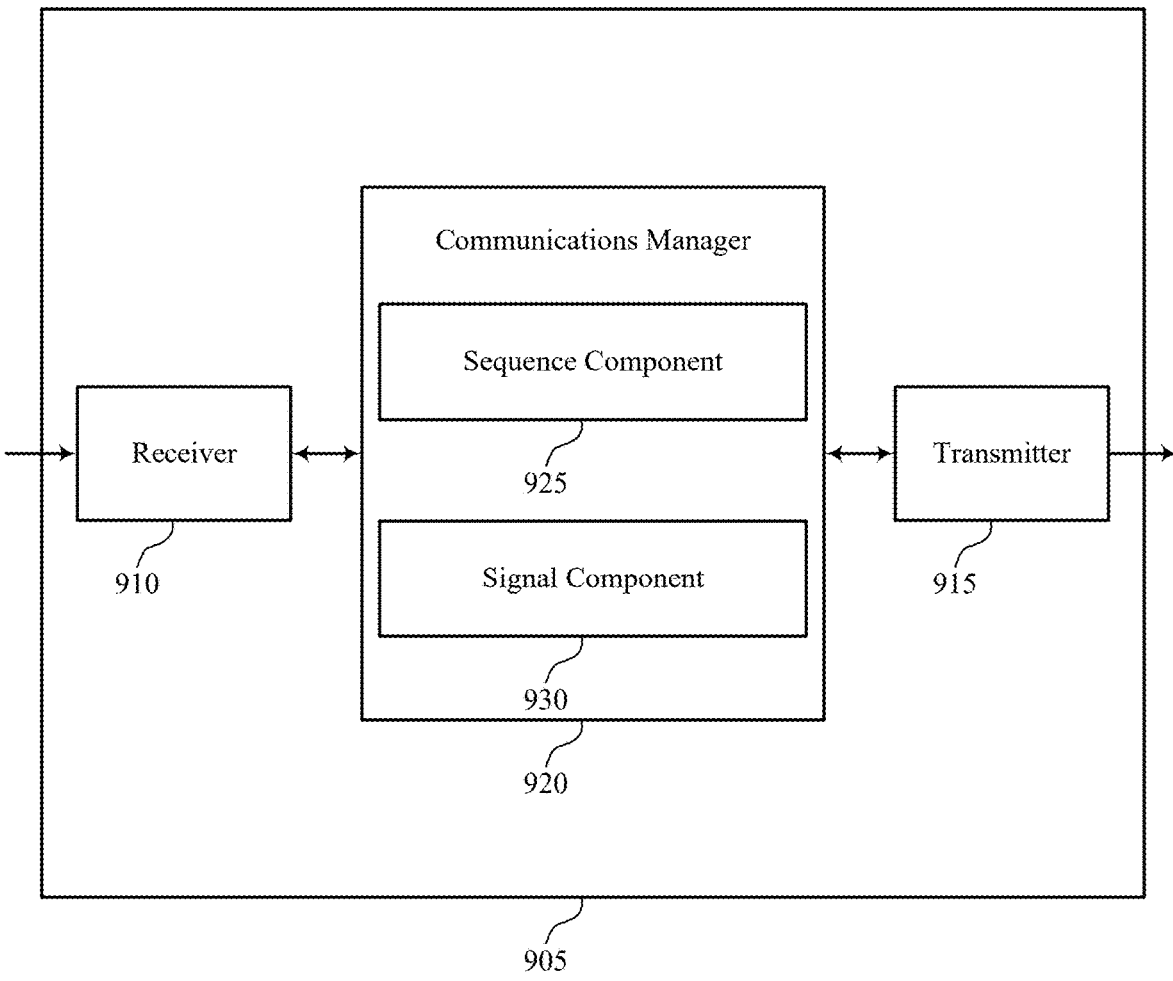

FIG. 9 shows a block diagram 900 of a device 905 that supports preamble design for A-IoT in accordance with one or more aspects of the present disclosure. The device 905 may be an example of aspects of a device 805 or a network entity 105 as described herein. The device 905 may include a receiver 910, a transmitter 915, and a communications manager 920. The device 905, or one of more components of the device 905 (e.g., the receiver 910, the transmitter 915, the communications manager 920), may include at least one processor, which may be coupled with at least one memory, to support the described techniques. Each of these components may be in communication with one another (e.g., via one or more buses).

The receiver 910 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 905. In some examples, the receiver 910 may support obtaining information by receiving signals via one or more antennas. Additionally, or alternatively, the receiver 910 may support obtaining information by receiving signals via one or more wired (e.g., electrical, fiber optic) interfaces, wireless interfaces, or any combination thereof.

The transmitter 915 may provide a means for outputting (e.g., transmitting, providing, conveying, sending) information generated by other components of the device 905. For example, the transmitter 915 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 915 may support outputting information by transmitting signals via one or more antennas. Additionally, or alternatively, the transmitter 915 may support outputting information by transmitting signals via one or more wired (e.g., electrical, fiber optic) interfaces, wireless interfaces, or any combination thereof. In some examples, the transmitter 915 and the receiver 910 may be co-located in a transceiver, which may include or be coupled with a modem.

The device 905, or various components thereof, may be an example of means for performing various aspects of preamble design for A-IoT as described herein. For example, the communications manager 920 may include a sequence component 925 a signal component 930, or any combination thereof. The communications manager 920 may be an example of aspects of a communications manager 820 as described herein. In some examples, the communications manager 920, or various components thereof, may be configured to perform various operations (e.g., receiving, obtaining, monitoring, outputting, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to obtain information, output information, or perform various other operations as described herein.

The communications manager 920 may support wireless communications in accordance with examples as disclosed herein. The sequence component 925 is capable of, configured to, or operable to support a means for generating signaling including a set of bits, where a preamble of the generated signaling includes a first subset of bits of the set of bits and a payload of the generated signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The signal component 930 is capable of, configured to, or operable to support a means for transmitting the signaling including the set of bits.

Figure 10:
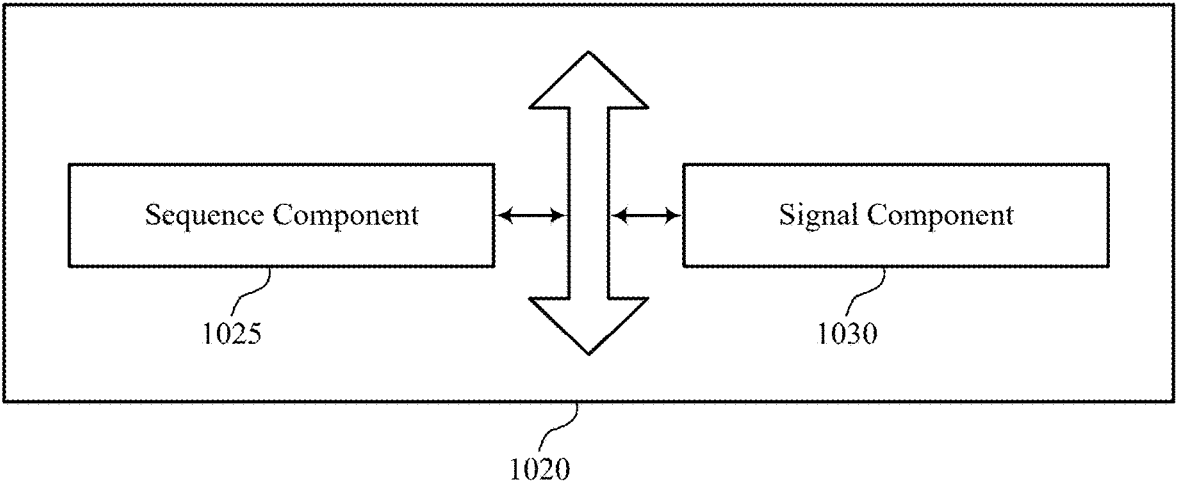
FIG. 10 shows a block diagram of a communications manager that supports preamble design for A-IoT in accordance with one or more aspects of the present disclosure.
Figure 10:

FIG. 10 shows a block diagram 1000 of a communications manager 1020 that supports preamble design for A-IoT in accordance with one or more aspects of the present disclosure. The communications manager 1020 may be an example of aspects of a communications manager 820, a communications manager 920, or both, as described herein. The communications manager 1020, or various components thereof, may be an example of means for performing various aspects of preamble design for A-IoT as described herein. For example, the communications manager 1020 may include a sequence component 1025 a signal component 1030, or any combination thereof. Each of these components, or components or subcomponents thereof (e.g., one or more processors, one or more memories), may communicate, directly or indirectly, with one another (e.g., via one or more buses). The communications may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1020 may support wireless communications in accordance with examples as disclosed herein. The sequence component 1025 is capable of, configured to, or operable to support a means for generating signaling including a set of bits, where a preamble of the generated signaling includes a first subset of bits of the set of bits and a payload of the generated signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The signal component 1030 is capable of, configured to, or operable to support a means for transmitting the signaling including the set of bits.

In some examples, the payload of the transmitted signaling including the second subset of bits is encoded according to a Manchester encoding scheme. In some examples, a first quantity of bits of the first subset of bits is associated with a default symbol duration. In some examples, the signaling includes an OOK waveform. In some examples, the set of bits includes a set of OOK bits. In some examples, a quantity of OOK symbols associated with the set of OOK bits corresponds to a quantity of OFDM symbols. In some examples, a length of the preamble is a less than a corresponding length of a shortest OFDM symbol duration associated with the quantity of OFDM symbols. In some examples, the length of the preamble corresponds to a first quantity of bits of the first subset of bits. In some examples, a length of the preamble is a greater than a corresponding length of a longest OFDM symbol duration associated with the quantity of OFDM symbols. In some examples, the length of the preamble corresponds to a first quantity of bits of the first subset of bits.

Figure 11:
FIG. 11 shows a diagram of a system including a device that supports preamble design for A-IoT in accordance with one or more aspects of the present disclosure.

FIG. 11 shows a diagram of a system 1100 including a device 1105 that supports preamble design for A-IoT in accordance with one or more aspects of the present disclosure. The device 1105 may be an example of or include components of a device 805, a device 905, or a network entity 105 as described herein. The device 1105 may communicate with other network devices or network equipment such as one or more of the network entities 105, UEs 115, or any combination thereof. The communications may include communications over one or more wired interfaces, over one or more wireless interfaces, or any combination thereof. The device 1105 may include components that support outputting and obtaining communications, such as a communications manager 1120, a transceiver 1110, one or more antennas 1115, at least one memory 1125, code 1130, and at least one processor 1135. These components may be in electronic communication or otherwise coupled (e.g., operatively, communicatively, functionally, electronically, electrically) via one or more buses (e.g., a bus 1140).

The transceiver 1110 may support bi-directional communications via wired links, wireless links, or both as described herein. In some examples, the transceiver 1110 may include a wired transceiver and may communicate bi-directionally with another wired transceiver. Additionally, or alternatively, in some examples, the transceiver 1110 may include a wireless transceiver and may communicate bi-directionally with another wireless transceiver. In some examples, the device 1105 may include one or more antennas 1115, which may be capable of transmitting or receiving wireless transmissions (e.g., concurrently). The transceiver 1110 may also include a modem to modulate signals, to provide the modulated signals for transmission (e.g., by one or more antennas 1115, by a wired transmitter), to receive modulated signals (e.g., from one or more antennas 1115, from a wired receiver), and to demodulate signals. In some implementations, the transceiver 1110 may include one or more interfaces, such as one or more interfaces coupled with the one or more antennas 1115 that are configured to support various receiving or obtaining operations, or one or more interfaces coupled with the one or more antennas 1115 that are configured to support various transmitting or outputting operations, or a combination thereof. In some implementations, the transceiver 1110 may include or be configured for coupling with one or more processors or one or more memory components that are operable to perform or support operations based on received or obtained information or signals, or to generate information or other signals for transmission or other outputting, or any combination thereof. In some implementations, the transceiver 1110, or the transceiver 1110 and the one or more antennas 1115, or the transceiver 1110 and the one or more antennas 1115 and one or more processors or one or more memory components (e.g., the at least one processor 1135, the at least one memory 1125, or both), may be included in a chip or chip assembly that is installed in the device 1105. In some examples, the transceiver 1110 may be operable to support communications via one or more communications links (e.g., communication link(s) 125, backhaul communication link(s) 120, a midhaul communication link 162, a fronthaul communication link 168).

The at least one memory 1125 may include RAM, ROM, or any combination thereof. The at least one memory 1125 may store computer-readable, computer-executable, or processor-executable code, such as the code 1130. The code 1130 may include instructions that, when executed by one or more of the at least one processor 1135, cause the device 1105 to perform various functions described herein. The code 1130 may be stored in a non-transitory computer-readable medium such as system memory or another type of memory. In some cases, the code 1130 may not be directly executable by a processor of the at least one processor 1135 but may cause a computer (e.g., when compiled and executed) to perform functions described herein. In some cases, the at least one memory 1125 may include, among other things, a BIOS which may control basic hardware or software operation such as the interaction with peripheral components or devices. In some examples, the at least one processor 1135 may include multiple processors and the at least one memory 1125 may include multiple memories. One or more of the multiple processors may be coupled with one or more of the multiple memories which may, individually or collectively, be configured to perform various functions herein (for example, as part of a processing system).

The at least one processor 1135 may include one or more intelligent hardware devices (e.g., one or more general-purpose processors, one or more DSPs, one or more CPUs, one or more graphics processing units (GPUs), one or more neural processing units (NPUs) (also referred to as neural network processors or deep learning processors (DLPs)), one or more microcontrollers, one or more ASICs, one or more FPGAs, one or more programmable logic devices, discrete gate or transistor logic, one or more discrete hardware components, or any combination thereof). In some cases, the at least one processor 1135 may be configured to operate a memory array using a memory controller. In some other cases, a memory controller may be integrated into one or more of the at least one processor 1135. The at least one processor 1135 may be configured to execute computer-readable instructions stored in a memory (e.g., one or more of the at least one memory 1125) to cause the device 1105 to perform various functions (e.g., functions or tasks supporting preamble design for A-IoT). For example, the device 1105 or a component of the device 1105 may include at least one processor 1135 and at least one memory 1125 coupled with one or more of the at least one processor 1135, the at least one processor 1135 and the at least one memory 1125 configured to perform various functions described herein. The at least one processor 1135 may be an example of a cloud-computing platform (e.g., one or more physical nodes and supporting software such as operating systems, virtual machines, or container instances) that may host the functions (e.g., by executing code 1130) to perform the functions of the device 1105. The at least one processor 1135 may be any one or more suitable processors capable of executing scripts or instructions of one or more software programs stored in the device 1105 (such as within one or more of the at least one memory 1125).

In some examples, the at least one processor 1135 may include multiple processors and the at least one memory 1125 may include multiple memories. One or more of the multiple processors may be coupled with one or more of the multiple memories, which may, individually or collectively, be configured to perform various functions herein. In some examples, the at least one processor 1135 may be a component of a processing system, which may refer to a system (such as a series) of machines, circuitry (including, for example, one or both of processor circuitry (which may include the at least one processor 1135) and memory circuitry (which may include the at least one memory 1125)), or components, that receives or obtains inputs and processes the inputs to produce, generate, or obtain a set of outputs. The processing system may be configured to perform one or more of the functions described herein. For example, the at least one processor 1135 or a processing system including the at least one processor 1135 may be configured to, configurable to, or operable to cause the device 1105 to perform one or more of the functions described herein. Further, as described herein, being "configured to," being "configurable to," and being "operable to" may be used interchangeably and may be associated with a capability, when executing code stored in the at least one memory 1125 or otherwise, to perform one or more of the functions described herein.

In some examples, a bus 1140 may support communications of (e.g., within) a protocol layer of a protocol stack. In some examples, a bus 1140 may support communications associated with a logical channel of a protocol stack (e.g., between protocol layers of a protocol stack), which may include communications performed within a component of the device 1105, or between different components of the device 1105 that may be co-located or located in different locations (e.g., where the device 1105 may refer to a system in which one or more of the communications manager 1120, the transceiver 1110, the at least one memory 1125, the code 1130, and the at least one processor 1135 may be located in one of the different components or divided between different components).

In some examples, the communications manager 1120 may manage aspects of communications with a core network 130 (e.g., via one or more wired or wireless backhaul links). For example, the communications manager 1120 may manage the transfer of data communications for client devices, such as one or more UEs 115. In some examples, the communications manager 1120 may manage communications with one or more other network entities 105, and may include a controller or scheduler for controlling communications with UEs 115 (e.g., in cooperation with the one or more other network devices). In some examples, the communications manager 1120 may support an X2 interface within an LTE/LTE-A wireless communications network technology to provide communication between network entities 105.

The communications manager 1120 may support wireless communications in accordance with examples as disclosed herein. For example, the communications manager 1120 is capable of, configured to, or operable to support a means for generating signaling including a set of bits, where a preamble of the generated signaling includes a first subset of bits of the set of bits and a payload of the generated signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The communications manager 1120 is capable of, configured to, or operable to support a means for transmitting the signaling including the set of bits.

By including or configuring the communications manager 1120 in accordance with examples as described herein, the device 1105 may support techniques for improved communication reliability, reduced latency, and improved coordination between devices.

In some examples, the communications manager 1120 may be configured to perform various operations (e.g., receiving, obtaining, monitoring, outputting, transmitting) using or otherwise in cooperation with the transceiver 1110, the one or more antennas 1115 (e.g., where applicable), or any combination thereof. Although the communications manager 1120 is illustrated as a separate component, in some examples, one or more functions described with reference to the communications manager 1120 may be supported by or performed by the transceiver 1110, one or more of the at least one processor 1135, one or more of the at least one memory 1125, the code 1130, or any combination thereof (for example, by a processing system including at least a portion of the at least one processor 1135, the at least one memory 1125, the code 1130, or any combination thereof). For example, the code 1130 may include instructions executable by one or more of the at least one processor 1135 to cause the device 1105 to perform various aspects of preamble design for A-IoT as described herein, or the at least one processor 1135 and the at least one memory 1125 may be otherwise configured to, individually or collectively, perform or support such operations.

FIG. 12 shows a flowchart illustrating a method 1200 that supports preamble design for A-IoT in accordance with one or more aspects of the present disclosure. The operations of the method 1200 may be implemented by a UE or its components as described herein. For example, the operations of the method 1200 may be performed by a UE 115 as described with reference to FIGS. 1 through 7. In some examples, a UE may execute a set of instructions to control the functional elements of the UE to perform the described functions. Additionally, or alternatively, the UE may perform aspects of the described functions using special-purpose hardware.

At 1205, the method may include receiving signaling including a set of bits, where a preamble of the received signaling includes a first subset of bits of the set of bits and a payload of the received signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The operations of 1205 may be performed in accordance with examples as disclosed herein. In some examples, aspects of the operations of 1205 may be performed by a signal component 625 as described with reference to FIG. 6.

At 1210, the method may include detecting the preamble of the received signaling including the first subset of bits. The operations of 1210 may be performed in accordance with examples as disclosed herein. In some examples, aspects of the operations of 1210 may be performed by a preamble component 630 as described with reference to FIG. 6.

At 1215, the method may include decoding the payload of the received signaling including the second subset of bits based at least in part on the detected preamble of the received signaling. The operations of 1215 may be performed in accordance with examples as disclosed herein. In some examples, aspects of the operations of 1215 may be performed by a payload component 635 as described with reference to FIG. 6.

FIG. 13 shows a flowchart illustrating a method 1300 that supports preamble design for A-IoT in accordance with one or more aspects of the present disclosure. The operations of the method 1300 may be implemented by a network entity or its components as described herein. For example, the operations of the method 1300 may be performed by a network entity as described with reference to FIGS. 1 through 3 and 8 through 11. In some examples, a network entity may execute a set of instructions to control the functional elements of the network entity to perform the described functions. Additionally, or alternatively, the network entity may perform aspects of the described functions using special-purpose hardware.

At 1305, the method may include generating signaling including a set of bits, where a preamble of the generated signaling includes a first subset of bits of the set of bits and a payload of the generated signaling includes a second subset of bits of the set of bits, the second subset of bits including fewer bits than the first subset of bits, where less than a threshold quantity of bits of the first subset of bits includes a same bit value, and where each bit of the threshold quantity of bits is consecutive. The operations of 1305 may be performed in accordance with examples as disclosed herein. In some examples, aspects of the operations of 1305 may be performed by a sequence component 1025 as described with reference to FIG. 10.

At 1310, the method may include transmitting the signaling including the set of bits. The operations of 1310 may be performed in accordance with examples as disclosed herein. In some examples, aspects of the operations of 1310 may be performed by a signal component 1030 as described with reference to FIG. 10.

It should be noted that the methods described herein describe possible implementations. The operations and the steps may be rearranged or otherwise modified and other implementations are possible. Further, aspects from two or more of the methods may be combined.

The following provides an overview of aspects of the present disclosure:

Aspect 1: A method for wireless communications at a device, comprising: receiving signaling comprising a set of bits, wherein a preamble of the received signaling comprises a first subset of bits of the set of bits and a payload of the received signaling comprises a second subset of bits of the set of bits, the second subset of bits comprising fewer bits than the first subset of bits, wherein less than a threshold quantity of bits of the first subset of bits comprises a same bit value, and wherein each bit of the threshold quantity of bits is consecutive; detecting the preamble of the received signaling comprising the first subset of bits; and decoding the payload of the received signaling comprising the second subset of bits based at least in part on the detected preamble of the received signaling.

Aspect 2: The method of aspect 1, wherein the payload of the received signaling comprising the second subset of bits is encoded according to a Manchester encoding scheme.

Aspect 3: The method of aspect 2, wherein the payload of the received signaling comprising the second subset of bits is decoded according to a Manchester decoding scheme.

Aspect 4: The method of any of aspects 1 through 3, wherein a first quantity of bits of the first subset of bits is associated with a default symbol duration.

Aspect 5: The method of any of aspects 1 through 4, wherein the signaling comprises an OOK waveform, the set of bits comprises a set of OOK bits, and a quantity of OOK symbols associated with the set of OOK bits corresponds to a quantity of OFDM symbols.

Aspect 6: The method of aspect 5, wherein a length of the preamble is a less than a corresponding length of a shortest OFDM symbol duration associated with the quantity of OFDM symbols, and the length of the preamble corresponds to a first quantity of bits of the first subset of bits.

Aspect 7: The method of any of aspects 5 through 6, wherein a length of the preamble is a greater than a corresponding length of a longest OFDM symbol duration associated with the quantity of OFDM symbols, and the length of the preamble corresponds to a first quantity of bits of the first subset of bits.

Aspect 8: The method of any of aspects 1 through 7, wherein the device comprises an A-IoT device.

Aspect 9: The method of aspect 8, further comprising: determining that an energy level of the A-IoT device satisfies a threshold value; and monitoring for the preamble of the signaling based at least in part on the energy level of the A-IoT device satisfying the threshold value.

Aspect 10: The method of aspect 9, further comprising: switching from a first mode of operation associated with the A-IoT device to a second mode of operation associated with the A-IoT device in response to the energy level of the A-IoT device satisfying the threshold value, wherein monitoring for the preamble of the signaling is based at least in part on switching from the first mode of operation associated with the A-IoT device to the second mode of operation associated with the A-IoT device.

Aspect 11: A method for wireless communications at a device, comprising: generating signaling comprising a set of bits, wherein a preamble of the received signaling comprises a first subset of bits of the set of bits and a payload of the received signaling comprises a second subset of bits of the set of bits, the second subset of bits comprising fewer bits than the first subset of bits, wherein less than a threshold quantity of bits of the first subset of bits comprises a same bit value, and wherein each bit of the threshold quantity of bits is consecutive; and transmitting the signaling comprising the set of bits.

Aspect 12: The method of aspect 11, wherein the payload of the transmitted signaling comprising the second subset of bits is encoded according to a Manchester encoding scheme.

Aspect 13: The method of any of aspects 11 through 12, wherein a first quantity of bits of the first subset of bits is associated with a default symbol duration.

Aspect 14: The method of any of aspects 11 through 13, wherein the signaling comprises an OOK waveform, the set of bits comprises a set of OOK bits, and a quantity of OOK symbols associated with the set of OOK bits corresponds to a quantity of OFDM symbols.

Aspect 15: The method of aspect 14, wherein a length of the preamble is a less than a corresponding length of a shortest OFDM symbol duration associated with the quantity of OFDM symbols, and the length of the preamble corresponds to a first quantity of bits of the first subset of bits.

Aspect 16: The method of any of aspects 14 through 15, wherein a length of the preamble is a greater than a corresponding length of a longest OFDM symbol duration associated with the quantity of OFDM symbols, and the length of the preamble corresponds to a first quantity of bits of the first subset of bits.

Aspect 17: A device for wireless communications, comprising one or more memories storing processor-executable code, and one or more processors coupled with (e.g., operatively, communicatively, functionally, electronically, or electrically) the one or more memories and individually or collectively operable to execute the code (e.g., directly, indirectly, after pre-processing, without pre-processing) to cause the device to perform a method of any of aspects 1 through 10.

Aspect 18: A device for wireless communications, comprising at least one means for performing a method of any of aspects 1 through 10.

Aspect 19: A non-transitory computer-readable medium storing code for wireless communications, the code comprising instructions executable by one or more processors (e.g., directly, indirectly, after pre-processing, without pre-processing) to perform a method of any of aspects 1 through 10.

Aspect 20: A device for wireless communications, comprising one or more memories storing processor-executable code, and one or more processors coupled with (e.g., operatively, communicatively, functionally, electronically, or electrically) the one or more memories and individually or collectively operable to execute the code (e.g., directly, indirectly, after pre-processing, without pre-processing) to cause the device to perform a method of any of aspects 11 through 16.

Aspect 21: A device for wireless communications, comprising at least one means for performing a method of any of aspects 11 through 16.

Aspect 22: A non-transitory computer-readable medium storing code for wireless communications, the code comprising instructions executable by one or more processors (e.g., directly, indirectly, after pre-processing, without pre-processing) to perform a method of any of aspects 11 through 16.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies, including future systems and radio technologies, not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, a graphics processing unit (GPU), a neural processing unit (NPU), an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, phase change memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk, and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., including a list of items prefaced by a phrase such as "at least one of" or "one or more of") indicates an inclusive list such that, for example, a list of at least one of A, B, or C means, e.g., A or B or C or AB or AC or BC or ABC (e.g., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, including in the claims, the article "a" before a noun is open-ended and understood to refer to "at least one" of those nouns or "one or more" of those nouns. Thus, the terms "a," "at least one," "one or more," and "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" or "identify" or "identifying" encompasses a variety of actions and, therefore, "determining" or "identifying" can include calculating, computing, processing, deriving, investigating, looking up (such as via looking up in a table, a database or another data structure), ascertaining and the like. Also, "determining" or "identifying" can include receiving (such as receiving information or signaling, e.g., receiving information or signaling for determining, receiving information or signaling for identifying), accessing (such as accessing data in a memory, or accessing information) and the like. Also, "determining" or "identifying" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label or other subsequent reference label.

The description set forth herein, in connection with the appended drawings, describes example configurations and does not represent all the examples that may be implemented or that are within the scope of the claims. The term "example" used herein means "serving as an example, instance, or illustration" and not "preferred" or "advantageous over other examples." The detailed description includes specific details for the purpose of providing an understanding of the described techniques. These techniques, however, may be practiced without these specific details. In some figures, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A device, comprising:
one or more memories storing processor-executable code; and
one or more processors coupled with the one or more memories and individually or collectively operable to execute the code to cause the device to:
receive signaling comprising a set of bits, wherein a preamble of the received signaling comprises a first subset of bits of the set of bits and a payload of the received signaling comprises a second subset of bits of the set of bits, the second subset of bits comprising fewer bits than the first subset of bits, wherein less than a threshold quantity of bits of the first subset of bits comprises a same bit value, and wherein each bit of the threshold quantity of bits is consecutive;
detect the preamble of the received signaling comprising the first subset of bits; and
decode the payload of the received signaling comprising the second subset of bits based at least in part on the detected preamble of the received signaling.

2. The device of claim 1, wherein the payload of the received signaling comprising the second subset of bits is encoded according to a Manchester encoding scheme.

3. The device of claim 2, wherein the payload of the received signaling comprising the second subset of bits is decoded according to a Manchester decoding scheme.

4. The device of claim 1, wherein a first quantity of bits of the first subset of bits is associated with a default symbol duration.

5. The device of claim 1, wherein:
the signaling comprises an on-off keying (OOK) waveform,
the set of bits comprises a set of OOK bits, and
a quantity of OOK symbols associated with the set of OOK bits corresponds to a quantity of orthogonal frequency division multiplexing (OFDM) symbols.

6. The device of claim 5, wherein:
a length of the preamble is a less than a corresponding length of a shortest OFDM symbol duration associated with the quantity of OFDM symbols, and the length of the preamble corresponds to a first quantity of bits of the first subset of bits.

7. The device of claim 5, wherein:

a length of the preamble is a greater than a corresponding length of a longest OFDM symbol duration associated with the quantity of OFDM symbols, and the length of the preamble corresponds to a first quantity of bits of the first subset of bits.

8. The device of claim 1, wherein the device comprises an Ambient Internet-of-Things (A-IoT) device.

9. The device of claim 8, wherein the one or more processors are individually or collectively further operable to execute the code to cause the device to:

determine that an energy level of the A-IoT device satisfies a threshold value; and monitor for the preamble of the signaling based at least in part on the energy level of the A-IoT device satisfying the threshold value.

10. The device of claim 9, wherein the one or more processors are individually or collectively further operable to execute the code to cause the device to:

switch from a first mode of operation associated with the A-IoT device to a second mode of operation associated with the A-IoT device in response to the energy level of the A-IoT device satisfying the threshold value, wherein monitor for the preamble of the signaling is based at least in part on switching from the first mode of operation associated with the A-IoT device to the second mode of operation associated with the A-IoT device.

11. A method for wireless communications at a device, comprising:

receiving signaling comprising a set of bits, wherein a preamble of the received signaling comprises a first subset of bits of the set of bits and a payload of the received signaling comprises a second subset of bits of the set of bits, the second subset of bits comprising fewer bits than the first subset of bits, wherein less than a threshold quantity of bits of the first subset of bits comprises a same bit value, and wherein each bit of the threshold quantity of bits is consecutive;

detecting the preamble of the received signaling comprising the first subset of bits; and decoding the payload of the received signaling comprising the second subset of bits based at least in part on the detected preamble of the received signaling.

12. The method of claim 11, wherein the payload of the received signaling comprising the second subset of bits is encoded according to a Manchester encoding scheme.

13. The method of claim 12, wherein the payload of the received signaling comprising the second subset of bits is decoded according to a Manchester decoding scheme.

14. The method of claim 11, wherein a first quantity of bits of the first subset of bits is associated with a default symbol duration.

15. A device, comprising:

one or more memories storing processor-executable code; and one or more processors coupled with the one or more memories and individually or collectively operable to execute the code to cause the device to:

generate signaling comprising a set of bits, wherein a preamble of the generated signaling comprises a first subset of bits of the set of bits and a payload of the generated signaling comprises a second subset of bits of the set of bits, the second subset of bits comprising fewer bits than the first subset of bits, wherein less than a threshold quantity of bits of the first subset of bits comprises a same bit value, and wherein each bit of the threshold quantity of bits is consecutive; and transmit the signaling comprising the set of bits.

16. The device of claim 15, wherein the payload of the transmitted signaling comprising the second subset of bits is encoded according to a Manchester encoding scheme.

17. The device of claim 15, wherein a first quantity of bits of the first subset of bits is associated with a default symbol duration.

18. The device of claim 15, wherein:

the signaling comprises an on-off keying (OOK) waveform, the set of bits comprises a set of OOK bits, and a quantity of OOK symbols associated with the set of OOK bits corresponds to a quantity of orthogonal frequency division multiplexing (OFDM) symbols.

19. The device of claim 18, wherein:

a length of the preamble is a less than a corresponding length of a shortest OFDM symbol duration associated with the quantity of OFDM symbols, and the length of the preamble corresponds to a first quantity of bits of the first subset of bits.

20. The device of claim 18, wherein:

a length of the preamble is a greater than a corresponding length of a longest OFDM symbol duration associated with the quantity of OFDM symbols, and the length of the preamble corresponds to a first quantity of bits of the first subset of bits.

* * * * *